(12) United States Patent
Kuisma et al.

(10) Patent No.: US 7,932,568 B2
(45) Date of Patent: Apr. 26, 2011

(54) MICROELECTROMECHANICAL COMPONENT

(75) Inventors: Heikki Kuisma, Helsinki (FI); Jiri Niemistö, Helsinki (FI)

(73) Assignee: VTI Technologies OY, Vantaa (FI)

( * ) Notice: Subject to any disclaimer, the term of this patent is extended or adjusted under 35 U.S.C. 154(b) by 1019 days.

(21) Appl. No.: 11/603,070

(22) Filed: Nov. 22, 2006

(65) Prior Publication Data

US 2007/0132047 A1 Jun. 14, 2007

(30) Foreign Application Priority Data

Nov. 23, 2005 (FI) ..................................... 20055618
Jul. 7, 2006 (FI) ..................................... 20065484

(51) Int. Cl.
*H01L 29/82* (2006.01)
*H01L 21/00* (2006.01)
(52) U.S. Cl. . 257/415; 257/414; 257/416; 257/E21.499; 438/50; 438/52
(58) Field of Classification Search .......... 257/415–417, 257/619, 685, 704, 404, 676, 678; 438/48–55
See application file for complete search history.

(56) References Cited

U.S. PATENT DOCUMENTS

| | | | |
|---|---|---|---|
| 7,511,376 B2 * | 3/2009 | Lin et al. ...................... | 257/734 |
| 2003/0001251 A1 * | 1/2003 | Cheever et al. ............... | 257/685 |
| 2003/0004878 A1 | 1/2003 | Akutsu et al. | |
| 2003/0119219 A1 * | 6/2003 | Farcy et al. ..................... | 438/51 |
| 2004/0262716 A1 | 12/2004 | Aoki | |
| 2005/0054133 A1 | 3/2005 | Felton et al. | |
| 2005/0218488 A1 | 10/2005 | Matsuo | |

FOREIGN PATENT DOCUMENTS

| | | |
|---|---|---|
| EP | 1433742 | 6/2004 |
| WO | WO 2004/037711 | 5/2004 |
| WO | WO 2005/000733 | 1/2005 |
| WO | WO2005104228 | 11/2005 |

OTHER PUBLICATIONS

International Search Report for International Application No. PCT/FI2006/050507, filed Nov. 21, 2006.

* cited by examiner

*Primary Examiner* — Dung A. Le
(74) *Attorney, Agent, or Firm* — Squire, Sanders & Dempsey (US) LLP

(57) ABSTRACT

The invention relates to microelectromechanical components, like microelectromechanical gauges used in measuring e.g. acceleration, angular acceleration, angular velocity, or other physical quantities. The microelectromechanical component, according to the invention, comprises, suitably bonded to each other, a microelectromechanical chip part sealed by a cover part, and at least one electronic circuit part. The aim of the invention is to provide an improved method of manufacturing a microelectromechanical component, and to provide a microelectromechanical component, which is applicable for use particularly in small microelectromechanical sensor solutions.

104 Claims, 21 Drawing Sheets

MICROELECTROMECHANICAL COMPONENT

FIELD OF THE INVENTION

The invention relates to microelectromechanical components, such as microelectromechanical gauges used in the measuring of, for example, acceleration, angular acceleration, angular velocity, or other physical quantities, microelectromechanical resonators and filters used for stabilizing the frequency of oscillation or filtering electrical signals, and other microelectromechanical devices, where a combination of encapsulated microelectromechanical parts and microcircuits is desired. The object of the present invention is to provide an improved method of manufacturing a microelectromechanical component, and a microelectromechanical component applicable for use particularly in small microelectromechanical sensor solutions, in solutions for stabilizing frequency of oscillation, in electric impedance matching solutions, in electrical signal switching solutions, or in solutions for filtering electrical signals.

BACKGROUND OF THE INVENTION

The use of microelectromechanical components (MEMS, Microelectromechanical Systems) in, for example, the sensor technique for measuring various physical quantities like acceleration, angular velocity, or pressure, has proved to be a reliable method of simple principle. In a microelectromechanical sensor, the measuring is based on, for example, the capacitive principle, wherein a change in the motional state of the sensor causes a displacement of a spring suspended seismic mass. The position of the mass can be detected by means of the capacitance between a pair of electrodes, the capacitance between the surfaces being dependent of their surface area and the distance between the surfaces. Measuring based on a microelectromechanical sensor can be used even at rather small metering ranges of various physical quantities.

In devices for data communications and data processing, integration of most of the functions has been accomplished into one or, at most, a few silicon chips. Due to their technological incompatibility, integration of functions responsible for synchronization of data processing, stabilization of radio frequencies, filtering an electrical signal, matching of electric impedances, and switching electrical signals, however, has not always been possible. In MEMS resonators and MEMS filters based on silicon technology, a silicon component, by means of electrostatic forces, for example, is set in mechanical oscillatory motion, and the shape and dimensions of the silicon component is given to control the impedance between the connectors due to the electro-acoustic coupling, or the propagation of a signal between the connectors. In a MEMS switch, the signal path is opened or closed by means of movable components manufactured with the MEMS technique, said components being controlled e.g. by electrostatic forces. For an impedance matching device, tiny passive components, such as coils or capacitors, are manufactured with MEMS techniques. The capacitors can be adjustable, air isolated MEMS structures.

Traditionally, integrated circuits are sealed by means of a technique, whereby they are installed e.g. onto a metal leadframe. At connection points of the circuits, connecting wires are bonded, the other ends of which are connected to bonding areas of the leadframe. Then the leadframe and the circuit are cast in plastic and finally the external connection areas or connection wires, by means of which the component will be connected to a circuit board, are formed by cutting, bending, or some other such method.

In the manufacturing of electronic components, a novel encapsulation method for silicon chips and similar electronic components is wafer-level packaging (WLP), wherein all encapsulation phases are performed on the surface of the silicon wafer prior to dicing. Hereby, significant savings in size and cost are achieved. Examples of such prior art methods would be the Ultra CSP-technique by Amkor Corporation (CSP, Chip Scale Packaging), in which thick layers of polymer are spread onto the surface of a silicon wafer, copper leads are deposited and soldering bumps, whereby the chip directly can be connected onto a circuit board, are installed or deposited.

The microelectromechanical components differ from electronic components, such as integrated circuits, in that, instead of passivation by means of a solid material, e.g. nitride passivation, the component requires mechanical protection, a cover, under which an open space remains, in which the electromechanical structures can move. Applying wafer-level packaging to microelectromechanical components is particularly tempting, since they are characterized by large size and, in particular, large thickness, and thus, encapsulated in a traditional manner they would be larger and, in particular, thicker than microcircuits encapsulated in a corresponding manner. On the other hand, the encapsulation of microelectromechanical components is problematic, due to the necessary cover.

The microelectromechanical components must be hermetically sealed, such that the moving parts remain in a chamber closed from the surroundings. The sealing can be made by bonding the microelectromechanical wafer to another wafer, a so called cover wafer. The utilization of cover wafers with microelectromechanical components is well known.

Another essential problem in microelectromechanical sensor components is the integration of electrical functions in association with the microelectromechanical component. This can be accomplished in a known manner by means of capsule level integration, having an external capsule comprising dielectric and conductive parts. In capsule level integration, the conductive wire connections between the parts integrate the parts into a unit.

Below, prior art is described with exemplifying reference to the accompanying drawings, of which:

FIG. 1 shows a method according to prior art for the manufacturing of a microelectromechanical component by means of monolithic integration, FIG. 2 shows a method according to prior art for the manufacturing of a microelectromechanical component by means of integration implemented in a plastic cast capsule.

FIG. 3 shows a method according to prior art for the manufacturing of a microelectromechanical component by means of integration implemented by stacking in a plastic cast capsule.

FIG. 1 shows a method according to prior art for the manufacturing of a microelectromechanical component by means of monolithic integration. In the method according to prior art for the manufacturing of a microelectromechanical component by means of monolithic integration, a microelectromechanical chip part 1 and an electronic circuit part 2 are manufactured on the same silicon wafer 3, and the electric connection between them is created by means of thin films of metal. The microelectromechanical chip part 1 and the electronic circuit part 2 are protected by means of a common cover part 4, they are connected by means of a wire connection 5, and are further cast in a plastic cast capsule 6. The prior art microelectromechanical component also comprises a metal leadframe 7.

FIG. 2 shows a method according to prior art for the manufacturing of a microelectromechanical component by means of integration implemented in a plastic cast capsule. In the method according to prior art for the manufacturing of a microelectromechanical component by means of integration in a plastic cast capsule, a microelectromechanical chip part 8 and an electronic circuit part 9 are separately manufactured onto the same silicon wafer element 10. The microelectromechanical chip part 8 is protected by means of a separate cover part 11. The electric connection between the microelectromechanical chip part 8 and the electronic circuit part 9 is implemented by means of a wire connection 12. The electronic circuit part 9 is connected by means of a wire connection 13. Subsequently, the entity composed of the microelectromechanical chip part 8 and the electronic circuit part 9 is cast in a plastic cast capsule 14. The prior art microelectromechanical component also comprises a metal leadframe 15.

FIG. 3 shows a method according to prior art for the manufacturing of a microelectromechanical component by means of integration implemented by stacking in a plastic cast capsule. In the method according to prior art for the manufacturing of a microelectromechanical component by means of integration by stacking in a plastic cast capsule, a microelectromechanical chip part 16 is manufactured onto a silicon wafer 17. The microelectromechanical chip part 16 is protected by means of separate cover part 18. An electronic circuit part 19 is manufactured on top of the cover part. The electric connection between the microelectromechanical chip part 16 and the electronic circuit part 19 is implemented by means of a wire connection 20. The microelectromechanical chip part 16 is connected by means of a wire connection 21. Then the entity composed of the microelectromechanical chip part 16 and the electronic circuit part 19 is cast in a plastic cast capsule 22. The prior art microelectromechanical component also comprises a metal leadframe 23.

A central problem in the solutions according to prior art for integrating the electrical functions of microelectromechanical components with the microelectromechanical component is the large size caused by the cover wafer and the two parts, the microelectromechanical chip part and the electronic circuit part. The size of the solution becomes large, when the components are cast in the kind of plastic capsule typically used in the field.

Additionally, a problem in the solutions according to prior art for integrating the electrical functions of microelectromechanical components with the microelectromechanical component is also the wasting of circuit solution surface area for bonding areas.

Thus, in the manufacturing of professional and consumer electronics, there is a clearly increasing requirement for small microelectromechanical components, in which integration of the electrical functions with the microelectromechanical component has been solved, and which are suitable for use particularly in small microelectromechanical sensor solutions, oscillation frequency stabilization solutions, electrical signal filtering solutions, electrical signal switching solutions and electric impedance matching solutions.

SUMMARY OF THE INVENTION

The object of the invention is an improved method for the manufacturing of a microelectromechanical component, and an improved microelectromechanical component. By means of this invention a microelectromechanical component solution is achieved, wherein electrical functions are integrated with the microelectromechanical component in a preferable manner, and which also is applicable for use, in particular, in small microelectromechanical motion sensor solutions, pressure sensor solutions, IMU (Inertia Measuring Unit) motion measuring instrument solutions, oscillation frequency stabilization solutions, electrical signal filtering solutions, electrical signal switching solutions, and electric impedance matching solutions.

The invention relates to microelectromechanical components like, for example, microelectromechanical gauges used in measuring e.g. acceleration, angular acceleration, angular velocity, pressure, or other physical quantities, or microelectromechanical devices used for stabilization of frequency of oscillation, electrical signal filtering, electrical signal switching, or electric impedance matching. An object of the invention is also to provide an improved method of manufacturing a microelectromechanical component, and a microelectromechanical component applicable for use, in particular, in small microelectromechanical sensor solutions, oscillation frequency stabilization solutions, electrical signal filtering solutions, electrical signal switching solutions, and electric impedance matching solutions.

According to a first characteristic of the invention, a method is provided for manufacturing a microelectromechanical component, in which method a microelectromechanical chip part is sealed by a cover part, which cover part is provided with lead-in structures for bringing electric connections through the cover part, such that, in the method, layer by layer at least one electronic circuit part is attached on top of said microelectromechanical chip part sealed by the cover part, and that bonding members for external connections of the microelectromechanical component are manufactured onto the surface of the uppermost electronic circuit part.

Preferably, in the method, the cover part is mainly made of glass, such that, in the cover part, conductive areas extending through the glass element are manufactured out of silicon. Alternatively, the cover part is mainly made of silicon, into which cover part glass insulation is manufactured, such that conductive areas extending through the glass insulation are manufactured out of silicon. Further, alternatively, the cover part is mainly made of silicon, into which cover part glass insulators are manufactured, such that the cover part is divided into strip-like conductive areas. Further, alternatively, the cover part is mainly made of silicon, into which cover part glass insulation is manufactured, such that the cover part is divided into insular conductive areas. Preferably, the cover part and/or the glass insulators are manufactured out of some other known dielectric material instead of glass. Preferably, the cover part and/or the conductive areas are manufactured out of some other known conductive material instead of silicon.

Preferably, in the method, the formation of an electric connection between the conductive lead-in of the cover part and the microelectromechanical chip part is implemented by means of a direct bond. Alternatively, the formation of an electric connection between the conductive lead-in of the cover part and the microelectromechanical chip part is implemented by means of metal layers located on the surface. Further, alternatively, the formation of an electric connection between the conductive lead-in of the cover part and the microelectromechanical chip part is implemented by means of a soldering bump.

Preferably, in the method, the lead-in structures of the cover part sealing the microelectromechanical chip part, located at the top surface of the cover part, are implemented such, that the external contact areas of the cover part extend all the way to the edges of the microelectromechanical component. Preferably a dielectric layer is manufactured on top of the top surface of the cover part.

Preferably, in the method, prior to attaching the cover part to the microelectromechanical chip part, a redistribution layer comprising the external connection areas of the cover part is manufactured between the top surface of the cover part and the dielectric layer. Alternatively, after attaching the cover part to the microelectromechanical chip part, a redistribution layer comprising the external connection areas of the cover part is manufactured between the top surface of the cover part and the dielectric layer.

Preferably, in the method, a layer isolating the cover part is manufactured between the redistribution layer comprising the external connection areas of the cover part, and the cover part. Preferably, said electronic circuit part is attached on top of the dielectric layer. Further, preferably, the dielectric layer serves as an adhesive layer for attaching the electronic circuit part. Alternatively a separate adhesive layer is used in attaching the electronic circuit part.

Preferably, in the method, a dielectric layer covering the circuit wafer is manufactured on top of the electronic circuit part. Further, preferably, lead-ins extending to the external connection areas of the cover part as well as to the electronic circuit part are manufactured into the dielectric layer covering the circuit wafer. Further, preferably, a wiring layer is implemented to the lead-ins, by means of the wiring of which a conductive connection is created between the conductive areas of the cover part and the electronic circuit part first to be attached onto said microelectromechanical chip part. Further, preferably, a wiring layer is implemented to the lead-ins, by means of the wiring of which a conductive connection is created for connecting the electronic circuit part first to be attached onto said microelectromechanical chip part.

Preferably, in the method, attaching at least one electronic circuit part onto said microelectromechanical chip part sealed by a cover part is implemented by performing the following series of operations at least once:
  a dielectric layer is manufactured on top of the dielectric layer covering the circuit wafer,
  said electronic circuit part is attached on top of the dielectric layer,
  a dielectric layer covering the circuit wafer is manufactured on top of the electronic circuit part, and
  into the dielectric layer covering the circuit wafer, lead-ins are manufactured extending to the wiring layer implemented to the lead-ins and to the electronic circuit part.

Preferably, in the method, the dielectric layer serves as an adhesive layer for attaching the electronic circuit part. Alternatively, a separate adhesive layer is used in attaching the electronic circuit part.

Preferably, in the method, a wiring layer is implemented to the lead-ins, by means of the wiring of which a conductive connection is created between the previously attached electronic circuit part and the electronic circuit part to be attached onto the dielectric layer. Further, preferably, a wiring layer is implemented to the lead-ins, by means of the wiring of which a conductive connection is created for connecting the electronic circuit part to be attached onto the dielectric layer.

Preferably, in the method, a protection layer is manufactured on top of the wiring layer implemented to the lead-ins. Further, preferably, into the protection layer, openings suitably extending to the contact surfaces of the wiring layer implemented to the lead-ins are manufactured for bonding members to be manufactured for the external connections of the microelectromechanical component.

Preferably, in the method, the bonding members to be manufactured for the external connections of the microelectromechanical component are implemented by means of wire connections. Further, preferably, a plastic cast capsule is cast over the microelectromechanical component. Alternatively, the bonding members to be manufactured for the external connections of the microelectromechanical component are implemented by means of bump connectors. Alternatively, the bonding members to be manufactured for the external connections of the microelectromechanical component are implemented by means of adhesive joints. Alternatively, the bonding members to be manufactured for the external connections of the microelectromechanical component are implemented by means of direct soldering joints. Further, preferably, the bonding members form a conductive connection to the capsule structure of the microelectromechanical component, said capsule structure being provided with conductive coatings. Further, preferably, the capsule structure of the microelectromechanical component is suitably designed to match the microelectromechanical component.

Preferably, in the method, the electronic circuit parts of the microelectromechanical component possess electrical signal processing capability. Preferably, electric functions of different kinds are distributed onto separate electronic circuit parts. Preferably, components causing interference and components sensitive to interference are positioned onto separate electronic circuit parts. Preferably, a separate EMI shield layer is added between the electronic circuit parts.

Preferably, in the method, antenna components are positioned onto separate electronic circuit parts. Further, preferably, sending antenna components and receiving antenna components are positioned onto separate electronic circuit parts. Further, preferably, an antenna ground layer is positioned between the electronic circuit parts comprising antenna components.

Preferably, in the method, sensor functions for measuring physical quantities are located in the electronic circuit parts of the microelectromechanical component. Further, preferably, circuit structures for detecting a magnetic field are located in the electronic circuit parts. Preferably, circuit structures for detecting temperature are located in the electronic circuit parts.

Preferably, a plate-like substrate comprising a set of said microelectromechanical chip parts sealed by a cover part serves as a base for installing the electronic circuit part. Further, preferably, a set of electronic circuit parts are installed, one by one, onto the surface of the plate-like substrate comprising the set of microelectromechanical chip parts sealed by a cover part. Further, preferably, only such electronic circuit parts, that have passed testing, are installed onto the surface of such microelectromechanical chip parts sealed by a cover part, which have passed testing.

Preferably, the plate-like substrate comprising the set of microelectromechanical chip parts sealed by a cover part is only diced after the installation phases. Preferably, the plate-like substrate comprising the set of microelectromechanical chip parts sealed by a cover part is only diced after final testing.

According to a second characteristic of the invention, a microelectromechanical component is provided, comprising a microelectromechanical chip part sealed by a cover part, which cover part is provided with lead-in structures for bringing electric connections through the cover part, such that at least one electronic circuit part has been attached, layer by layer, on top of said microelectromechanical chip part sealed by the cover part, and that, on the surface of the uppermost electronic circuit part, bonding members have been manufactured for the external connections of the microelectromechanical component.

Preferably, the cover part has been made mainly of glass, such that in the cover part, conductive areas of silicon have been manufactured extending through the glass element. Alternatively, the cover part has been made mainly of silicon, and onto which cover part glass insulation has been manufactured, such that, in the cover part, conductive areas have been manufactured leading through the glass insulation. Further, preferably, the cover part is made mainly of silicon, and, in the cover part, glass insulators have been manufactured such, that the cover part is divided into strip-like conductive areas. Further, preferably, the cover part has been made mainly of silicon, and, in which cover part, glass insulation has been manufactured, such that the cover part is divided into insular conductive areas. Preferably, the cover part and/or the glass insulators have been manufactured out of some other known dielectric material instead of glass. Preferably, the cover part and/or the conductive areas have been manufactured out of some other known conductive material instead of silicon.

Preferably, the formation of an electric connection between the conductive lead-in of the cover part and the microelectromechanical chip part has been implemented by means of a direct bond. Alternatively, the formation of an electric connection between the conductive lead-in of the cover part and the microelectromechanical chip part has been implemented by means of metal layers located on the surface. Further, alternatively, the formation of an electric connection between the conductive lead-in of the cover part and the microelectromechanical chip part has been implemented by means of a soldering bump.

Preferably, the lead-in structures of the cover part sealing the microelectromechanical chip part have been implemented on the top surface of the cover part, such that the external contact areas of the cover part extend all the way to the edges of the microelectromechanical component. Preferably, a dielectric layer has been manufactured onto the top surface of the cover part. Further, preferably, the dielectric layer covers the whole surface of the cover part.

Preferably, a redistribution layer comprising the external contact areas of the cover part has been manufactured between the top surface of the cover part and the dielectric layer. Further, preferably, a layer isolating the cover part has been manufactured between the redistribution layer comprising the external connection areas of the cover part and the cover part. Preferably, said electronic circuit part is attached on top of the dielectric layer.

Preferably, a dielectric layer covering the circuit wafer has been manufactured on top of the electronic circuit part. Further, preferably, lead-ins extending to the external contact areas of the cover part as well as to the electronic circuit part have been manufactured into the dielectric layer covering the circuit wafer. Further, preferably, a wiring layer has been implemented to the lead-ins, by means of the wiring of which a conductive connection has been created between the conductive areas of the cover part and the electronic circuit part first to be attached onto said microelectromechanical chip part. Further, preferably, a wiring layer has been implemented to the lead-ins, by means of the wiring of which a conductive connection has been created for connecting the electronic circuit part first to be attached onto said microelectromechanical chip part.

Preferably, attaching at least one electronic circuit part onto said microelectromechanical chip part sealed by a cover part has been implemented by performing the following series of operations at least once:
 a dielectric layer has been manufactured on top of the dielectric layer covering the circuit wafer,
 said electronic circuit part has been attached on top of the dielectric layer,
 a dielectric layer covering the circuit wafer has been manufactured on top of the electronic circuit part, and
 into the dielectric layer covering the circuit wafer, lead-ins have been manufactured extending to the wiring layer implemented to the lead-ins and to the electronic circuit part.

Preferably, the dielectric layer covers the whole surface of the cover part. Preferably, a wiring layer has been implemented to the lead-ins, by means of the wiring of which a conductive connection has been created between the previously attached electronic circuit part and the electronic circuit part to be attached onto the dielectric layer. Preferably, a wiring layer has been implemented to the lead-ins, by means of the wiring of which a conductive connection has been created for connecting the electronic circuit part to be attached onto the dielectric layer.

Preferably, a protection layer has been manufactured on top of the wiring layer implemented to the lead-ins. Further, preferably, into the protection layer, openings suitably extending to the contact surfaces of the wiring layer implemented to the lead-ins have been manufactured for bonding members to be manufactured for the external connections of the microelectromechanical component.

Preferably, the bonding members to be manufactured for the external connections of the microelectromechanical component have been implemented by means of wire connections. Further, preferably, a plastic cast capsule has been cast over the microelectromechanical component. Alternatively, the bonding members to be manufactured for the external connections of the microelectromechanical component have been implemented by means of bump connectors. Alternatively, the bonding members to be manufactured for the external connections of the microelectromechanical component have been implemented by means of adhesive joints. Alternatively, the bonding members to be manufactured for the external connections of the microelectromechanical component have been implemented by means of direct soldering joints. Further, preferably, the bonding members form a conductive connection to the capsule structure of the microelectromechanical component, said capsule structure having conductive coatings. Further, preferably, the capsule structure of the microelectromechanical component has been suitably designed to match the microelectromechanical component.

Preferably, the electronic circuit parts of the microelectromechanical component possess electrical signal processing capability. Preferably, electric functions of different kinds have been distributed onto separate electronic circuit parts. Preferably, components causing interference and components sensitive to interference have been positioned onto separate electronic circuit parts. Preferably, a separate EMI shield layer has been added between the electronic circuit parts.

Preferably, antenna components have been positioned on separate electronic circuit parts. Further, preferably, sending antenna components and receiving antenna components have been positioned on separate electronic circuit parts. Further, preferably, an antenna ground layer has been positioned between the electronic circuit parts comprising antenna components.

Preferably, sensor functions for measuring physical quantities are located in electronic circuit parts of the microelectromechanical component. Further, preferably, circuit structures for detecting a magnetic field are located in the electronic circuit parts. Preferably, circuit structures for detecting temperature are located in the electronic circuit parts.

According to a third characteristic of the invention, a microelectromechanical acceleration sensor is provided, comprising a microelectromechanical chip part, which has been sealed by a cover part, which cover part contains lead-in structures for bringing electric connections through the cover part, such that, on top of said microelectromechanical chip part sealed by the cover part, at least one electronic circuit part has been attached, layer by layer, and that, onto the surface of the topmost electronic circuit part, bonding members have been manufactured for the external connections of the microelectromechanical component.

According to a fourth characteristic of the invention, a microelectromechanical sensor of angular acceleration is provided, comprising a microelectromechanical chip part, which has been sealed by a cover part, which cover part contains with lead-in structures for bringing electric connections through the cover part, such that, on top of said microelectromechanical chip part sealed by the cover part, at least one electronic circuit part has been attached, layer by layer, and that, onto the surface of the topmost electronic circuit part, bonding members have been manufactured for the external connections of the microelectromechanical component.

According to a fifth characteristic of the invention, a microelectromechanical sensor of angular velocity is provided, comprising a microelectromechanical chip part, which has been sealed by a cover part, which cover part contains lead-in structures for bringing electric connections through the cover part, such that, on top of said microelectromechanical chip part sealed by the cover part, at least one electronic circuit part has been attached, layer by layer, and that, onto the surface of the topmost electronic circuit part, bonding members have been manufactured for the external connections of the microelectromechanical component.

According to a sixth characteristic of the invention, a microelectromechanical pressure sensor is provided, comprising a microelectromechanical chip part, which has been sealed by a cover part, which cover part contains lead-in structures for bringing electric connections through the cover part, such that, on top of said microelectromechanical chip part sealed by the cover part, at least one electronic circuit part has been attached, layer by layer, and that, onto the surface of the topmost electronic circuit part, bonding members have been manufactured for the external connections of the microelectromechanical component.

According to a seventh characteristic of the invention, a microelectromechanical IMU motion measuring instrument unit (IMU, Inertia Measurement Unit) is provided, comprising a microelectromechanical chip part, which has been sealed by a cover part, which cover part contains lead-in structures for bringing electric connections through the cover part, such that, on top of said microelectromechanical chip part sealed by the cover part, at least one electronic circuit part has been attached, layer by layer, and that, onto the surface of the topmost electronic circuit part, bonding members have been manufactured for the external connections of the microelectromechanical component.

According to an eighth characteristic of the invention, a microelectromechanical stabilizer of frequency of oscillation is provided, comprising a microelectromechanical chip part, which has been sealed by a cover part, which cover part contains lead-in structures for bringing electric connections through the cover part, such that, on top of said microelectromechanical chip part sealed by the cover part, at least one electronic circuit part has been attached, layer by layer, and that, onto the surface of the topmost electronic circuit part, bonding members have been manufactured for the external connections of the microelectromechanical component.

According to an ninth characteristic of the invention, a microelectromechanical electrical signal filter is provided, comprising a microelectromechanical chip part, which has been sealed by a cover part, which cover part contains lead-in structures for bringing electric connections through the cover part, such that, on top of said microelectromechanical chip part sealed by the cover part, at least one electronic circuit part has been attached, layer by layer, and that, onto the surface of the topmost electronic circuit part, bonding members have been manufactured for the external connections of the microelectromechanical component.

According to a tenth characteristic of the invention, a microelectromechanical electrical signal switching component is provided, comprising a microelectromechanical chip part, which has been sealed by a cover part, which cover part contains lead-in structures for bringing electric connections through the cover part, such that, on top of said microelectromechanical chip part sealed by the cover part, at least one electronic circuit part has been attached, layer by layer, and that, onto the surface of the topmost electronic circuit part, bonding members have been manufactured for the external connections of the microelectromechanical component.

According to a eleventh characteristic of the invention, a microelectromechanical electric impedance matching device is provided, comprising a microelectromechanical chip part, which has been sealed by a cover part, which cover part contains lead-in structures for bringing electric connections through the cover part, such that, on top of said microelectromechanical chip part sealed by the cover part, at least one electronic circuit part has been attached, layer by layer, and that, onto the surface of the topmost electronic circuit part, bonding members have been manufactured for the external connections of the microelectromechanical component.

According to an twelfth characteristic of the invention, a microelectromechanical inclination compensated compass is provided, comprising a microelectromechanical chip part, which has been sealed by a cover part, which cover part contains lead-in structures for bringing electric connections through the cover part, such that, on top of said microelectromechanical chip part sealed by the cover part, at least one electronic circuit part has been attached, layer by layer, and that, onto the surface of the topmost electronic circuit part, bonding members have been manufactured for the external connections of the microelectromechanical component.

BRIEF DESCRIPTION OF THE DRAWINGS

Below, the invention and its preferable embodiments are described in detail with exemplifying reference to the attached figures, of which.

Figure 1:
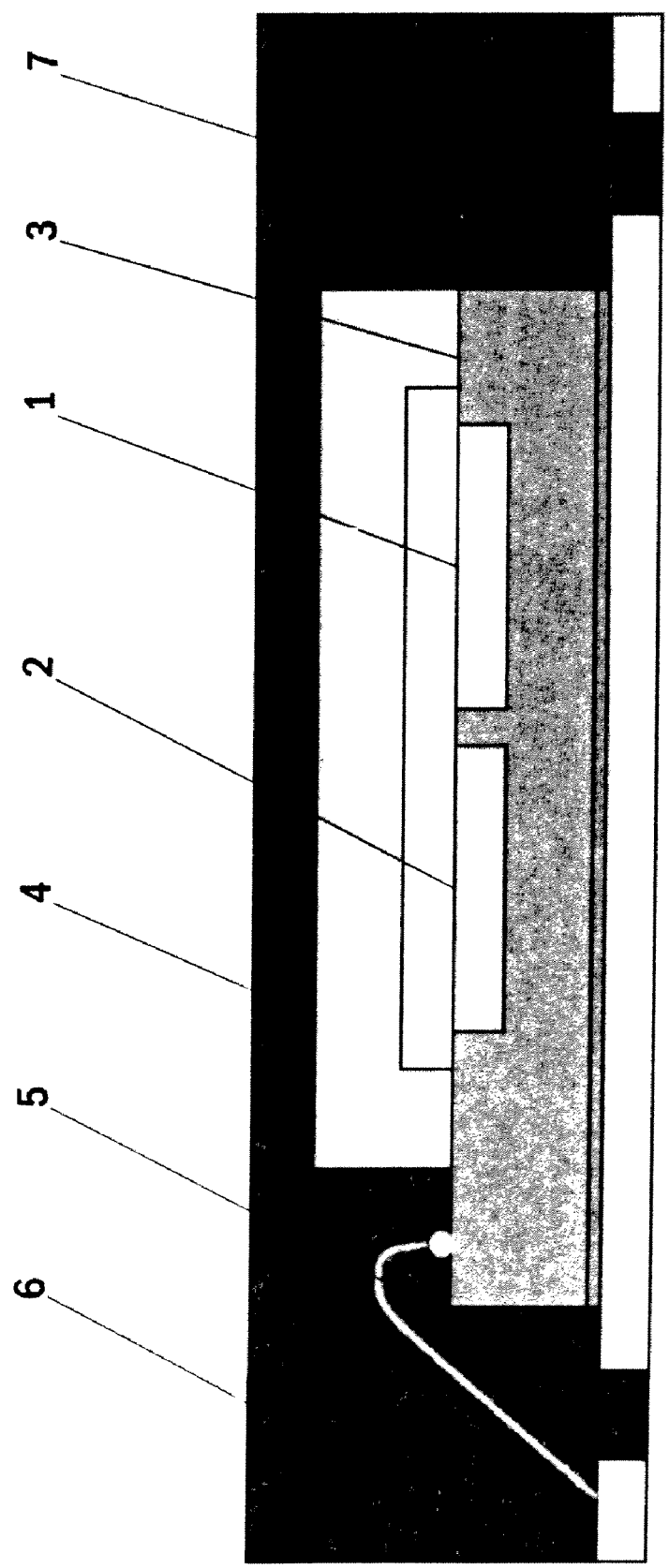
FIG. 1 shows a method, according to prior art, for manufacturing a microelectromechanical component by means of monolithic integration.
Figure 2:
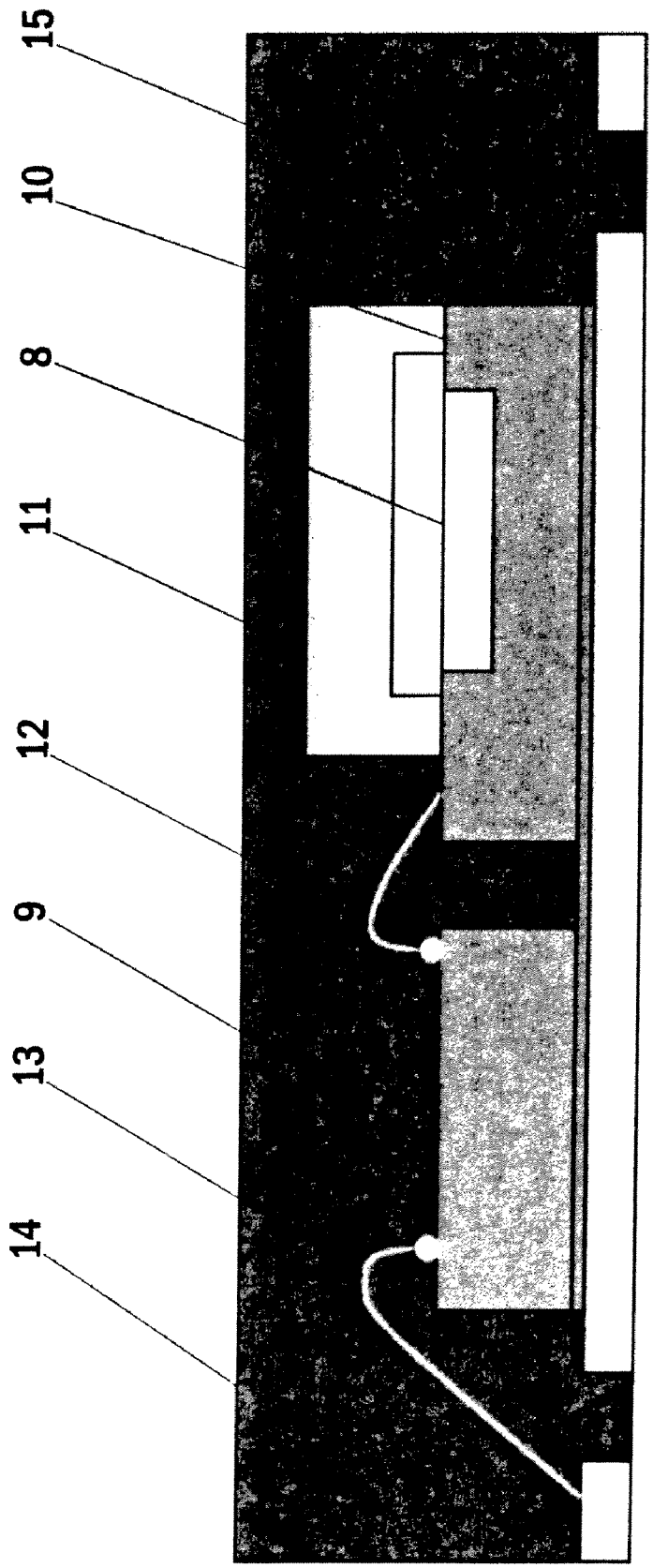
FIG. 2 shows a method, according to prior art, for manufacturing a microelectromechanical component by means of integration implemented in a plastic cast capsule.
Figure 3:
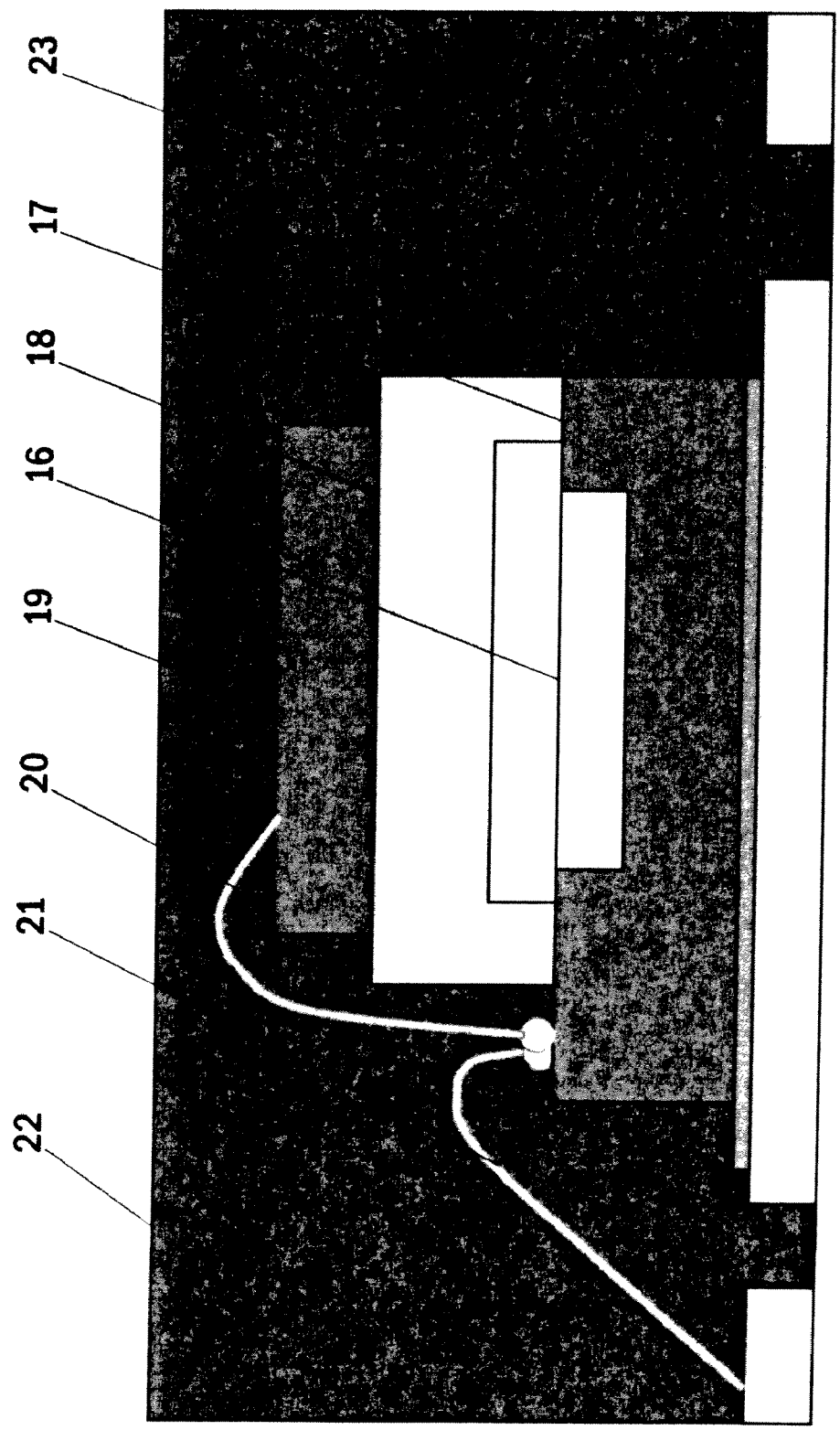
FIG. 3 shows a method, according to prior art, for manufacturing a microelectromechanical component by means of integration implemented by stacking in a plastic cast capsule.

The FIGS. 1-3 were presented above. Below, the invention and its preferable embodiments are described with reference to the FIGS. 4-23.

DETAILED DESCRIPTION OF THE INVENTION

Figure 4:
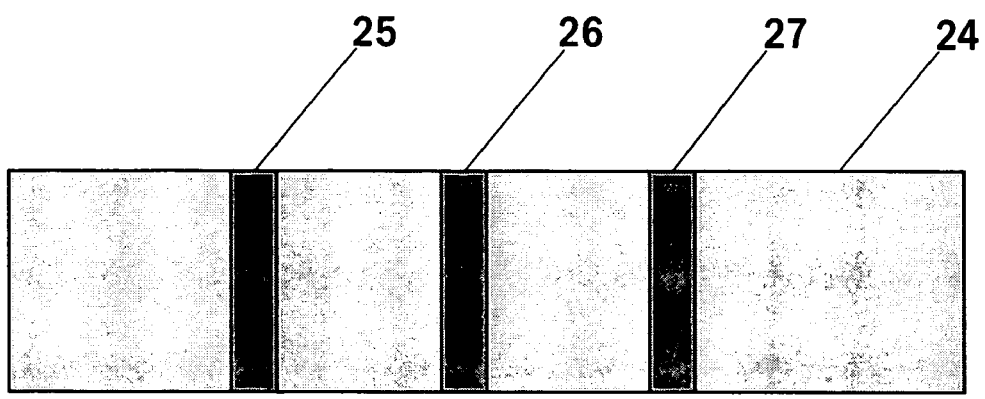
FIG. 4 shows a cover part of a microelectromechanical component solution, according to the invention, in a sectional and a projection view.
Figure 4:
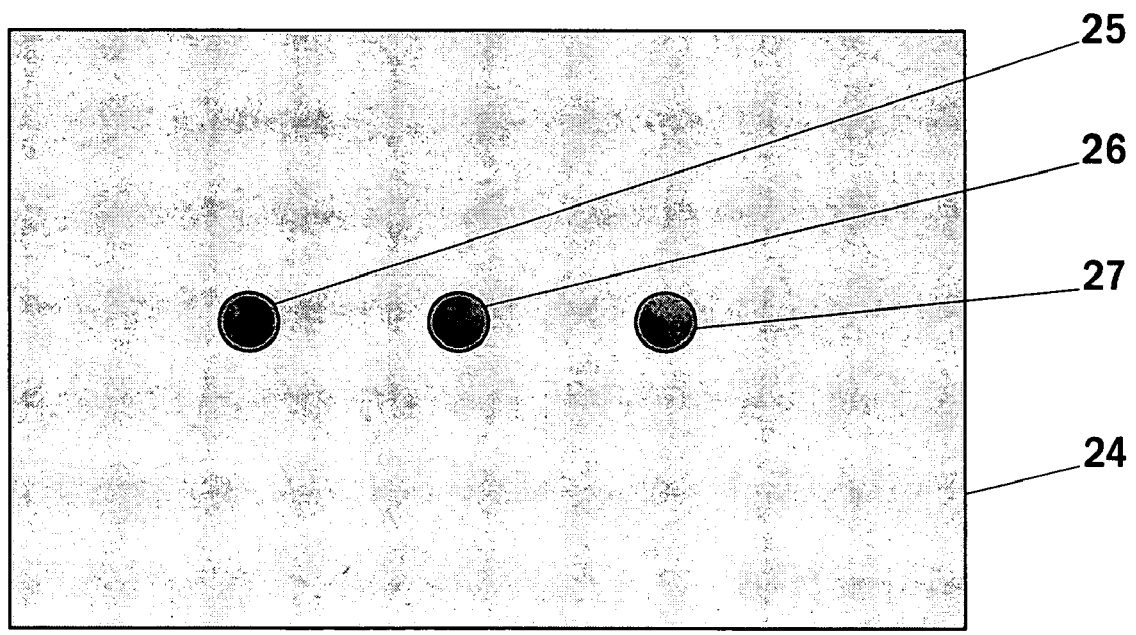

FIG. 4 shows a cover part of a microelectromechanical component solution, according to the invention, in a sectional and a projection view. The cover part of the microelectromechanical component solution, according to the invention, is indicated by the numeral 24, and it is typically mainly made of glass. The cover part 24 comprises conductive areas 25-27 extending through the glass element, which conductive areas 25-27 typically are made of silicon. The conductive areas 25-27 can be narrow and high.

Figure 5:
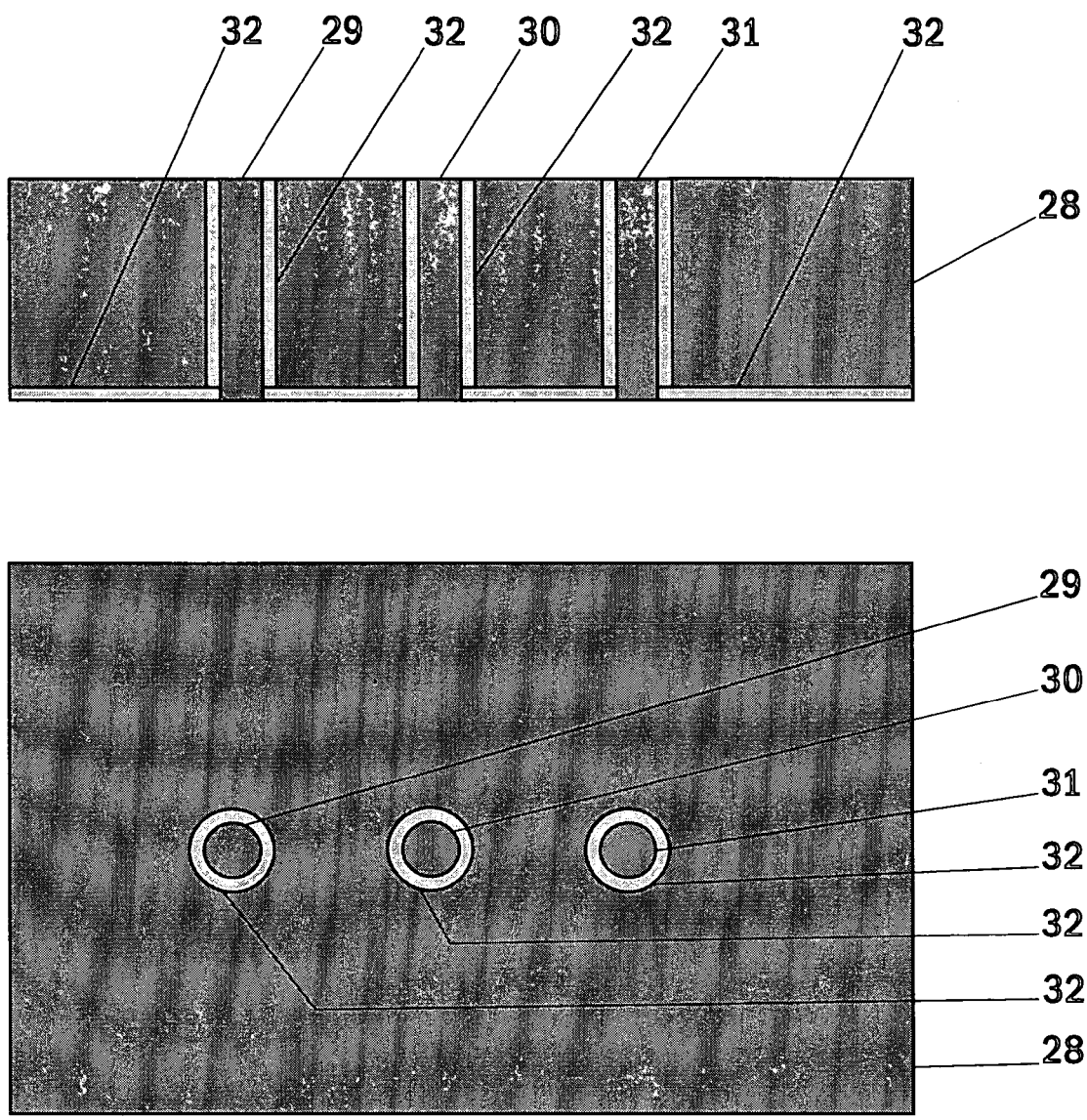
FIG. 5 shows an alternative cover part of a microelectromechanical component solution, according to the invention, in a sectional and a projection view.

FIG. 5 shows, in a sectional and a projection view, an alternative cover part of a microelectromechanical component solution according to the invention. The alternative cover part of the microelectromechanical component solution, according to the invention, is indicated by the numeral 28, and it is mainly made of silicon. The alternative cover part 28 comprises conductive areas 29-31 extending through the element, which conductive areas 29-31 typically are made of silicon. The conductive areas 29-31 of the alternative cover part 28 are isolated from the body of the cover part 28 by glass insulation 32, which glass insulation 32 also isolates the bottom of the cover part 28. The conductive areas 29-31 can be narrow and high.

Figure 6:
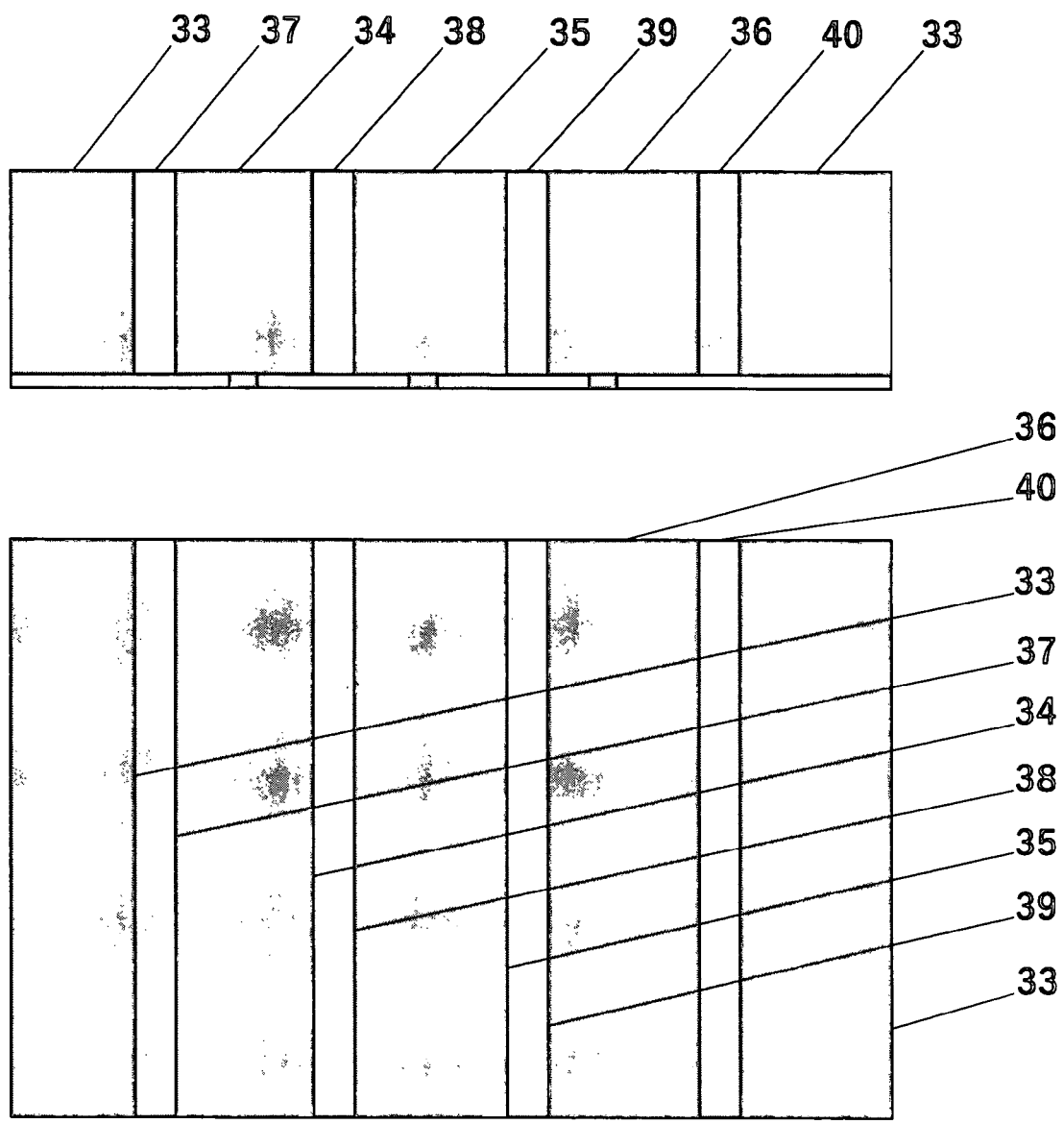
FIG. 6 shows a second alternative cover part of a microelectromechanical component solution, according to the invention, in a sectional and a projection view, FIG. 7 a third alternative cover part of a microelectromechanical component solution, according to the invention, in a sectional and a projection view.

FIG. 6 shows a second alternative cover part of a microelectromechanical component solution, according to the invention, in a sectional and a projection view. The second alternative cover part of the microelectromechanical component solution, according to the invention, is indicated by the numeral 33, and it is mainly made of silicon. The second alternative cover part 33 is divided into strip-like conductive areas 34-36 by means of narrow glass insulators 37-40. The conductive areas 34-36 are typically made of silicon. The glass insulators 37-40 of the second alternative cover part 33 also isolate the bottom of the cover part 33.

Figure 7:
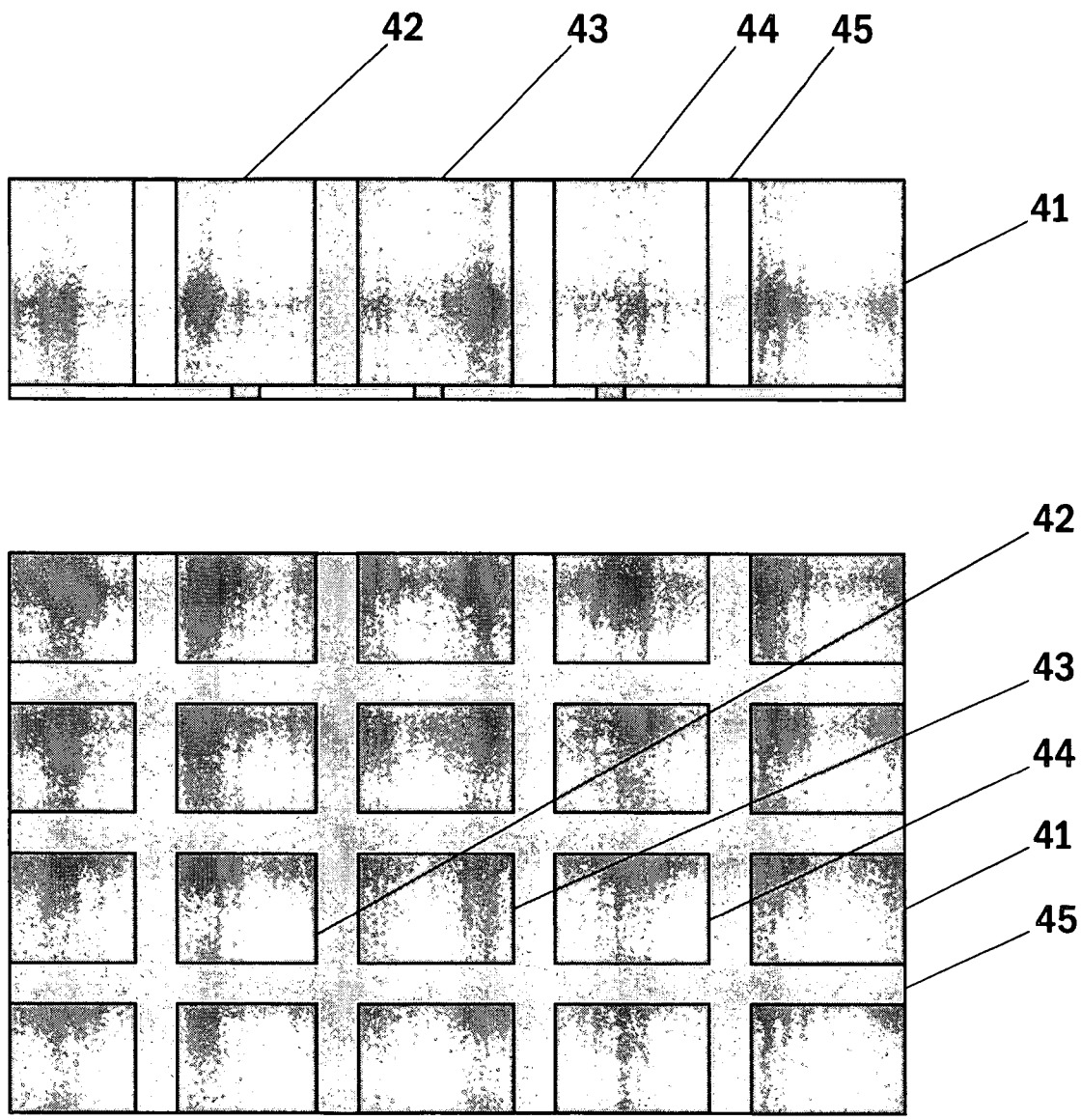

FIG. 7 shows, in a sectional and a projection view, a third alternative cover part of a microelectromechanical component solution according to the invention. The third alternative cover part of the microelectromechanical component solution, according to the invention, is indicated by the numeral 41, and it is mainly made of silicon. The third alternative cover part 41 is divided into insular conductive areas 42-44 by means of narrow glass insulators 45. The conductive areas 42-44 typically are made of silicon. The glass insulation 45 of the third alternative cover part 41 also isolates the bottom of the cover part 41.

In the solution according to the invention, other kinds of cover parts can also be used, in which mutually isolated electric connections are formed through the cover part from one plane surface to the other, essentially perpendicularly through the cover part.

Figure 8:
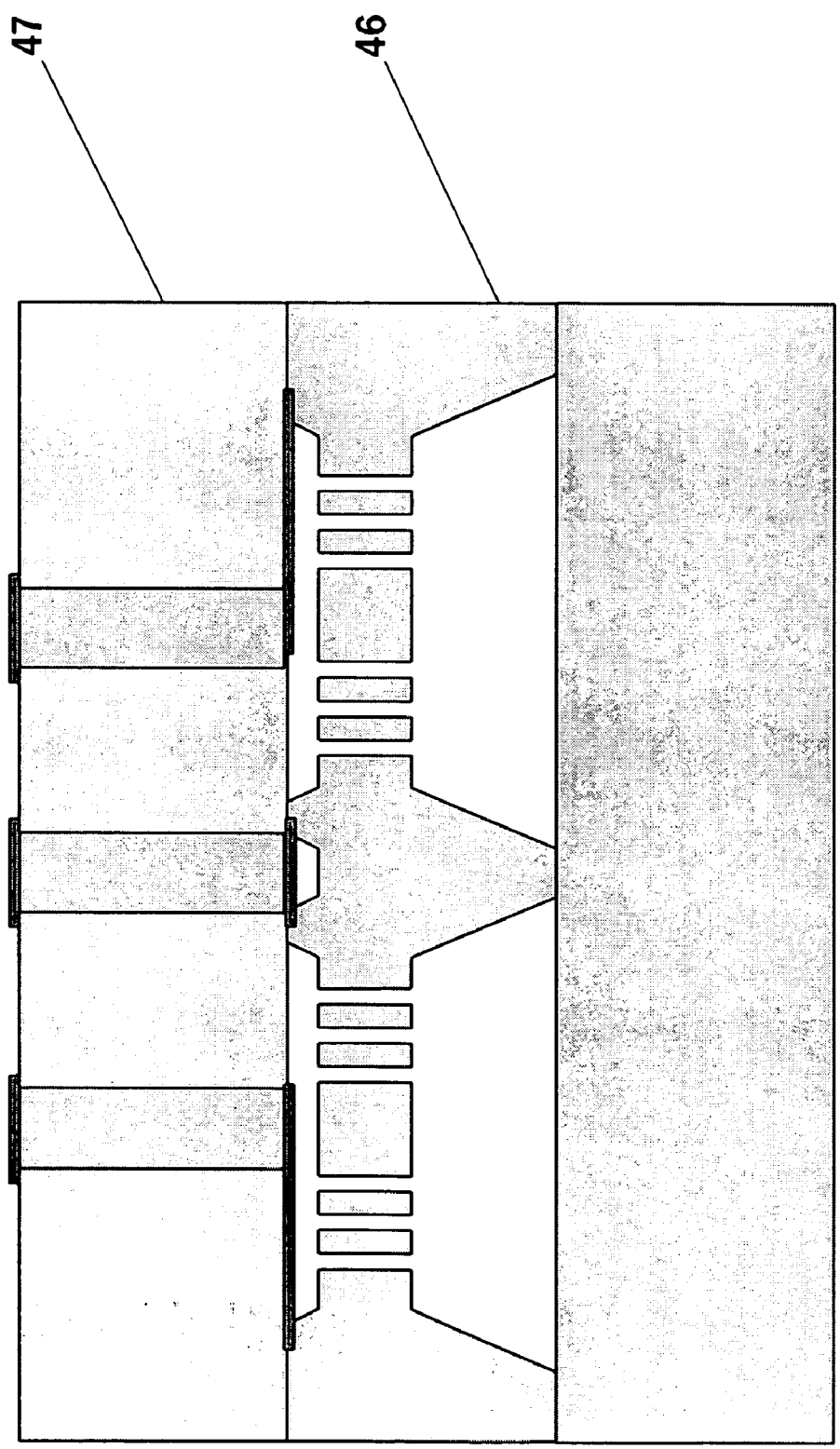
FIG. 8 shows a sectional view of attaching the cover part of a microelectromechanical component solution, according to the invention, to a microelectromechanical chip part.

FIG. 8 shows a sectional view of attaching the cover part of a microelectromechanical component solution, according to the invention, to a microelectromechanical chip part. In the solution according to the invention, the microelectromechanical chip part 46 is sealed by the cover part 47 having lead-in structures for bringing electric connections through the cover part 47. In the solution according to the invention, electric connections are brought by means of silicon lead-ins from the microelectromechanical chip part 46 at the bottom to the plane surface of the glass cover part 47.

Formation of a joint between the conductive lead-in of the cover part 47 of the microelectromechanical component solution and the microelectromechanical chip part 46 can occur directly, by means of metal layers on the surface, by means of a soldering bump, or by some other bonding means, or by other means.

Figure 9:
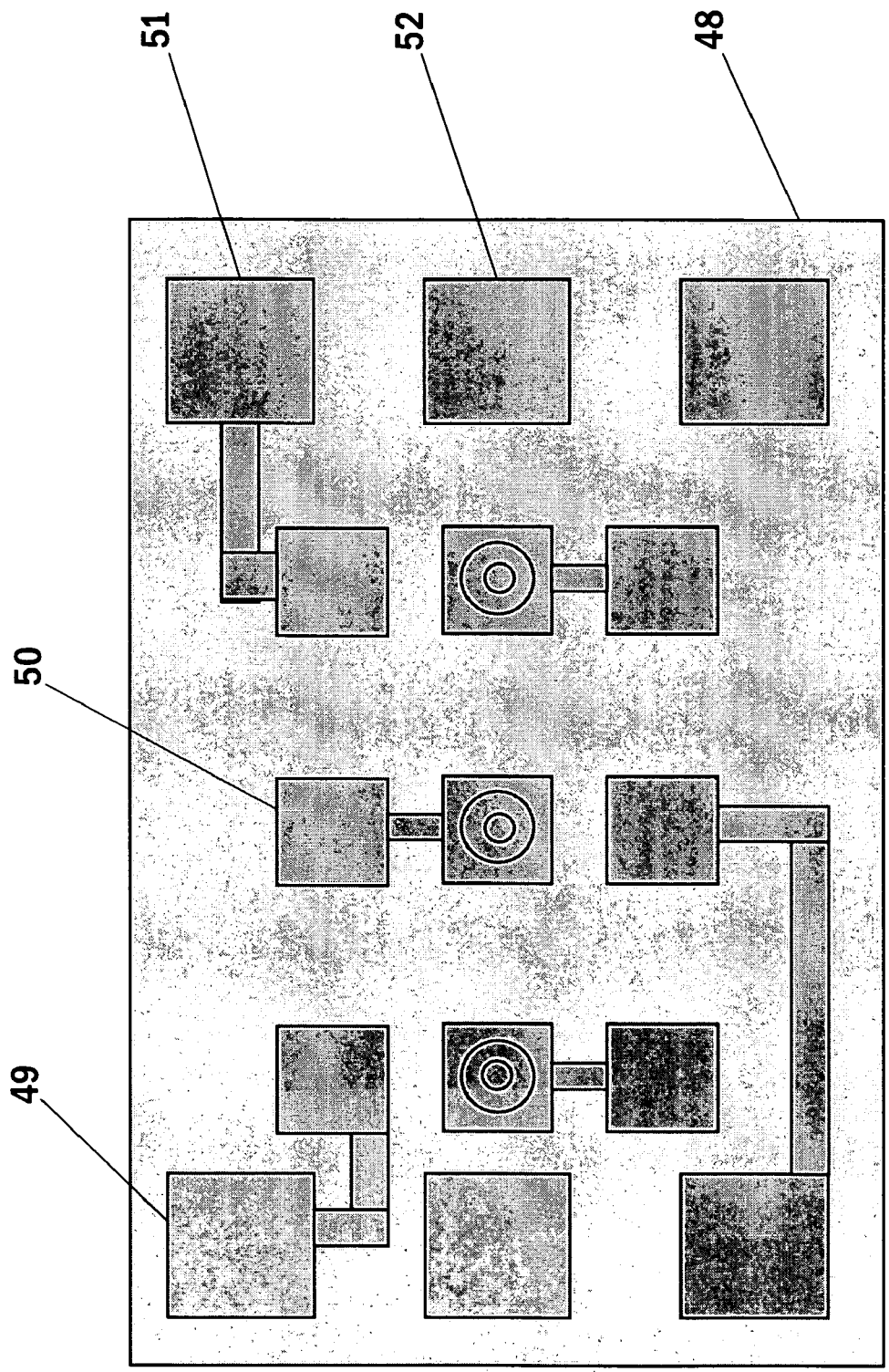
FIG. 9 shows a projection view of an exemplifying redistribution layer solution of the cover part of a microelectromechanical component solution according to the invention.

FIG. 9 shows a projection view of an exemplifying redistribution layer solution of the cover part of a microelectromechanical component solution according to the invention. On the surface of the cover part 48 of a microelectromechanical component solution according to the invention, conductive contact areas 49-52 are manufactured by means of a redistribution layer 49-52, which conductive areas provide an electric conductive connection between the lead-ins and wiring layers later to be manufactured onto the surface. Such said contact areas 49-52 are contact areas both for an electronic circuit part and contact areas for external connections of the microelectromechanical component solution.

The redistribution layer, comprising the external contact areas 49-52 of the cover part, is manufactured either before or after attaching the cover part 48 of the microelectromechanical component solution to the microelectromechanical chip part. The conductive redistribution layer 49-52, according to the invention, enables positions for the lead-in of the cover part and the lead-in for the wiring layer, later to be manufactured, as preferable as possible for both of them independent of the position of the other. By means of the conductive redistribution layer 49-52, a connection can be created, besides between a lead-in of the cover part and a lead-in of the wiring layer, also between wiring layer lead-ins serving some other purpose.

Figure 10:
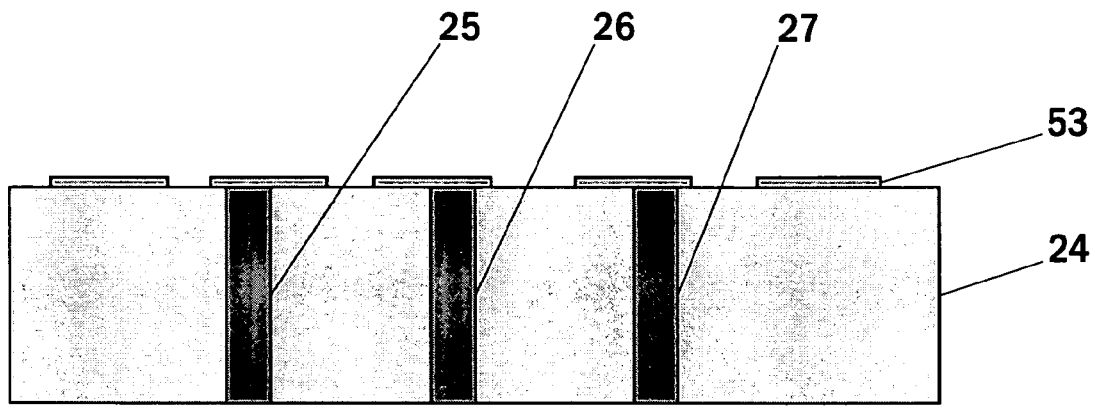
FIG. 10 shows a sectional view of an exemplifying redistribution layer solution of the cover part of a microelectromechanical component solution according to the invention.

FIG. 10 shows a sectional view of an exemplifying redistribution layer solution of the cover part of a microelectromechanical component solution according to the invention. The exemplifying cover part of a microelectromechanical component solution, according to the invention, is indicated by the numeral 24, and typically it is mainly made of glass. The cover part 24 comprises conductive areas 25-27 extending through the glass element, which conductive areas 25-27 typically are made of silicon.

On the surface of the exemplifying cover part 24 of a microelectromechanical component solution, according to the invention, a conductive redistribution layer 53 is manufactured, which provides an electric conductive connection between the lead-ins of the cover part and wiring layers later to be manufactured onto the surface. Since the exemplifying cover part 24 is made mainly of a dielectric material, the conductive redistribution layer 53 can be located directly on the surface of the cover part 24.

Figure 11:
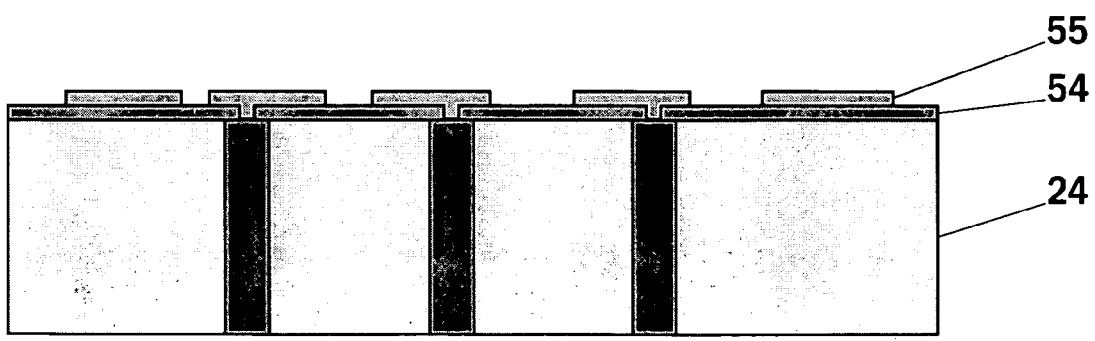
FIG. 11 shows a sectional view of an alternative redistribution layer solution of the cover part of a microelectromechanical component solution according to the invention.

FIG. 11 shows a sectional view of an alternative redistribution layer solution of the cover part of a microelectromechanical component solution according to the invention. The cover part of the microelectromechanical component solution, according to the invention, is indicated by the numeral 24, and, typically, it is mainly made of glass. The cover part 24 comprises conductive areas extending through the glass element, which conductive areas typically are made of silicon.

Firstly, onto the surface of the cover part 24 of a microelectromechanical component solution, according to the invention, a dielectric layer 54 is manufactured. By means of the dielectric layer 54 of the cover part 24, according to the invention, an optimal strength of the surface of the cover part 24 can be achieved, for example. Next, onto the surface of the cover part 24, according to the invention, a conductive redistribution layer 55 is manufactured, which provides an electric conductive connection between the lead-ins of the cover part and the wiring layers later to be manufactured onto the surface. The structure of the redistribution layer, comprising the external contact areas 55 of the cover part, and the functions of its various areas are the same as those depicted in the projection view of FIG. 9 for the redistribution layer manufactured directly onto the surface of the lead-in wafer.

Figure 12:
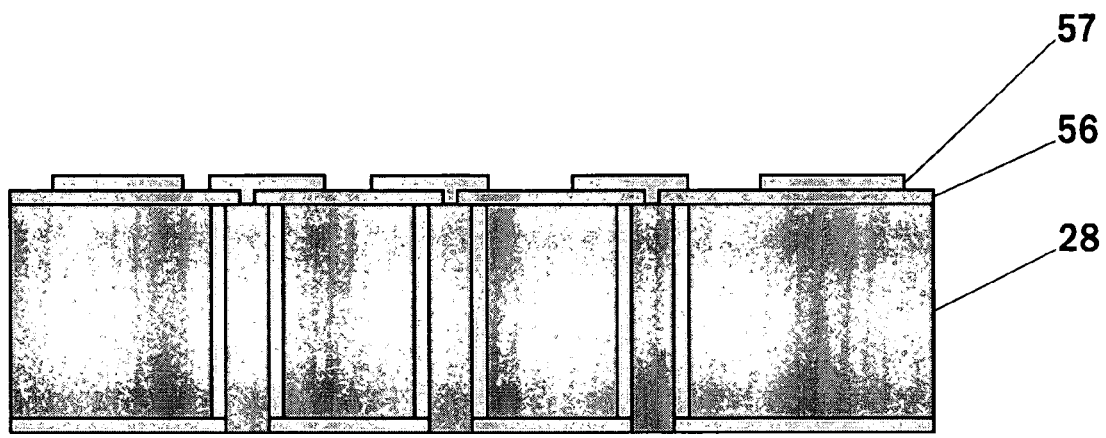
FIG. 12 shows a sectional view of a second alternative redistribution layer solution of the cover part of a microelectromechanical component solution according to the invention.

FIG. 12 shows a sectional view of a second alternative redistribution layer solution of the cover part of a microelectromechanical component solution according to the invention. The cover part of the microelectromechanical component solution, according to the invention, is indicated by the numeral 28, and it is mainly made of silicon. The cover part 28 comprises conductive areas extending through the silicon element, which conductive areas typically are made of silicon. The conductive areas of the cover part 28 are isolated from the body of the cover part 28 by means of a glass insulator, which also isolates the bottom of the cover part 28.

Firstly, a dielectric layer 56 is manufactured onto the surface of the cover part 28 of a microelectromechanical component solution according to the invention. By means of the dielectric layer 56 of the cover part 28 according to the invention, an optimal strength of the surface of the cover part 28 can be achieved, for example. The dielectric layer is also necessitated by the choice of material for the cover part. Next, onto the surface of the cover part 28, according to the invention, a conductive redistribution layer 57 is manufactured, which provides an electric conductive connection between the lead-ins of the cover part and the wiring layers later to be manufactured onto the surface.

Figure 13:
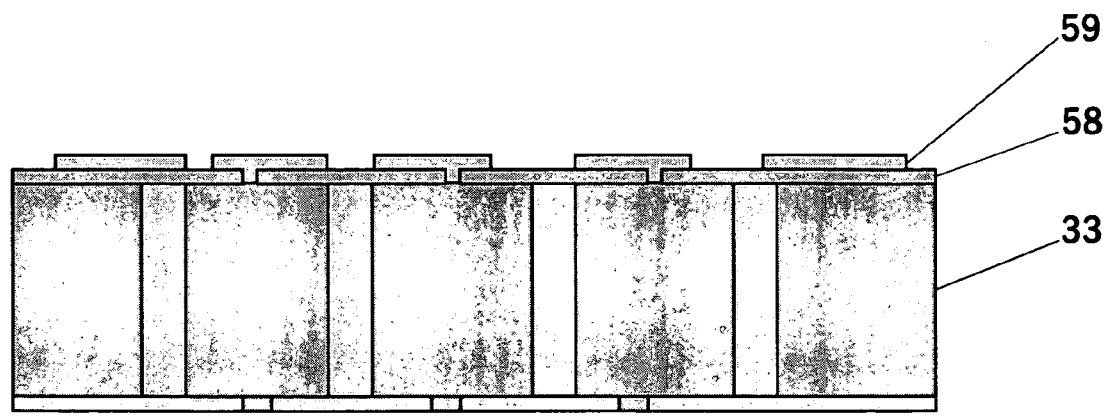
FIG. 13 shows a sectional view of a third alternative redistribution layer solution of the cover part of a microelectromechanical component solution according to the invention.

FIG. 13 shows a sectional view of a third alternative redistribution layer solution of the cover part of a microelectromechanical component solution according to the invention. The cover part of the microelectromechanical component solution, according to the invention, is indicated by the numeral 33, and it is mainly made of silicon. The cover part 33 is divided into strip-like conductive areas by means of narrow glass insulators. The conductive areas typically are made of silicon. The glass insulators of the third alternative cover part 33 also isolate the bottom of the cover part 33.

Firstly, onto the surface of the cover part 33 of the microelectromechanical component solution, according to the invention, a dielectric layer 58 is manufactured. By means of the dielectric layer 58 of the cover part 33, according to the invention, an optimal strength of the surface of the cover part 33 can be achieved, for example. The dielectric layer is also necessitated by the choice of material for the cover part. Next, onto the surface of the cover part 33, according to the invention, a conductive redistribution layer 59 is manufactured, which provides an electric conductive connection between the lead-ins of the cover part and the wiring layers later to be manufactured onto the surface.

Figure 14:
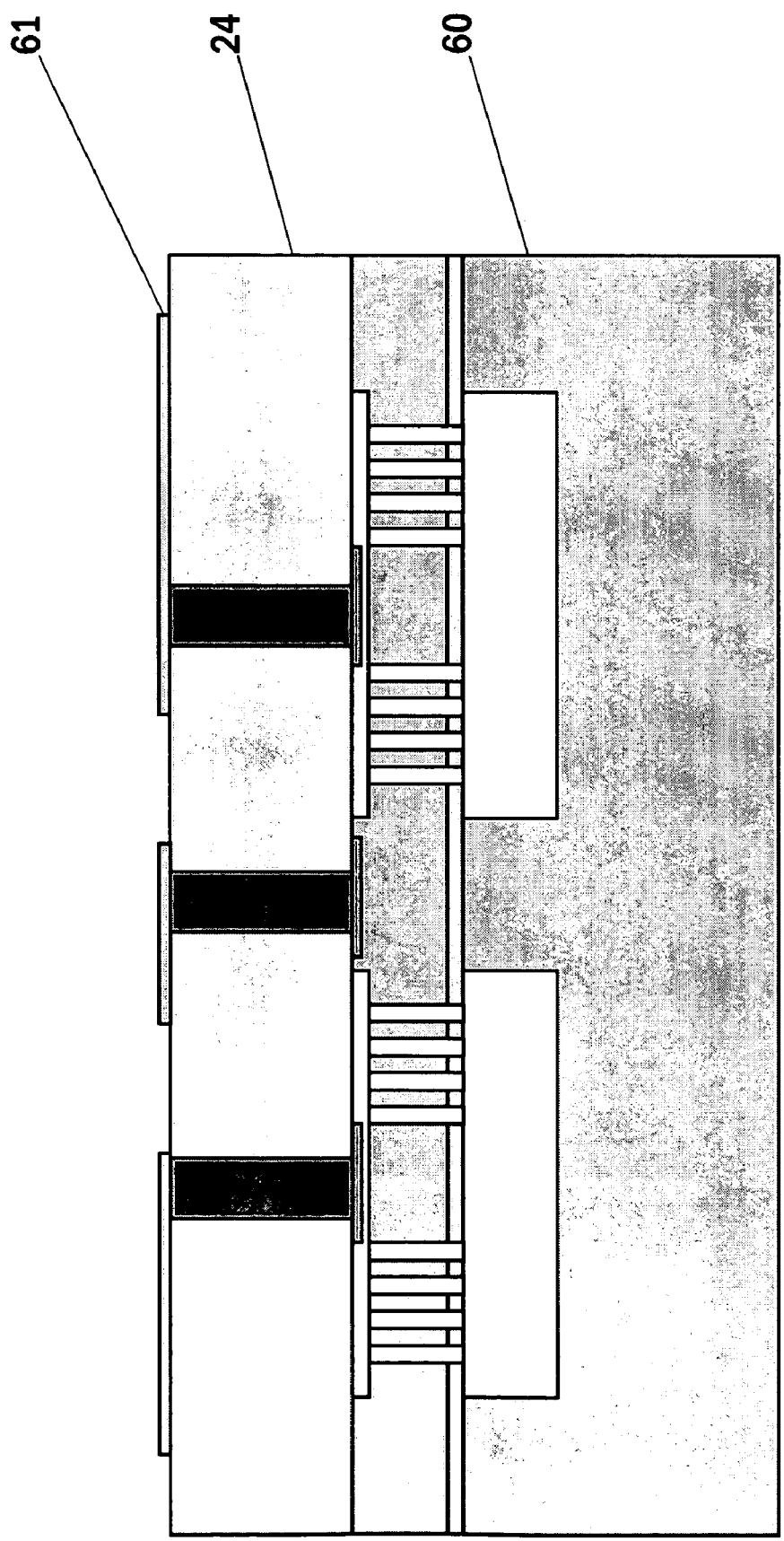
FIG. 14 shows a sectional view of attaching to a microelectromechanical chip part an alternative cover part of a microelectromechanical component solution according to the invention.

FIG. 14 shows a sectional view of attaching to a microelectromechanical chip part an alternative cover part of a microelectromechanical component solution according to the invention. In the solution according to the invention, the microelectromechanical chip part 60 is sealed by a cover part 24, which typically is mainly made of glass.

The cover part 24 comprises, extending through the glass element, conductive lead-in structures, typically made of silicon, for bringing electric connections through the cover part 24. In the solution according to the invention, electric connections are, by means of silicon lead-ins, brought to the plane surface of the glass cover part 24 from the microelectromechanical chip part 60, at the bottom.

The formation of a connection between a conductive lead-in of the cover part 24 of the microelectromechanical component solution and the microelectromechanical chip part 60 can occur directly, via metal layers on the surface, a soldering bump, or through some other bonding means, or in other manners.

A conductive redistribution layer 61 is manufactured onto the surface of the alternative cover part 24 of the microelectromechanical component solution according to the invention, which redistribution layer provides an electric conductive connection between the lead-ins of the cover part and wiring layers later to be manufactured onto the surface. A layer isolating the cover part may be located between the redistribution layer comprising the external contact areas 61 of the cover part and the cover part 24. Alternatively, since the cover part 24 is mainly made of dielectric materials, the redistribution layer 61 may be located directly on the surface of the cover part 24.

Figure 15:
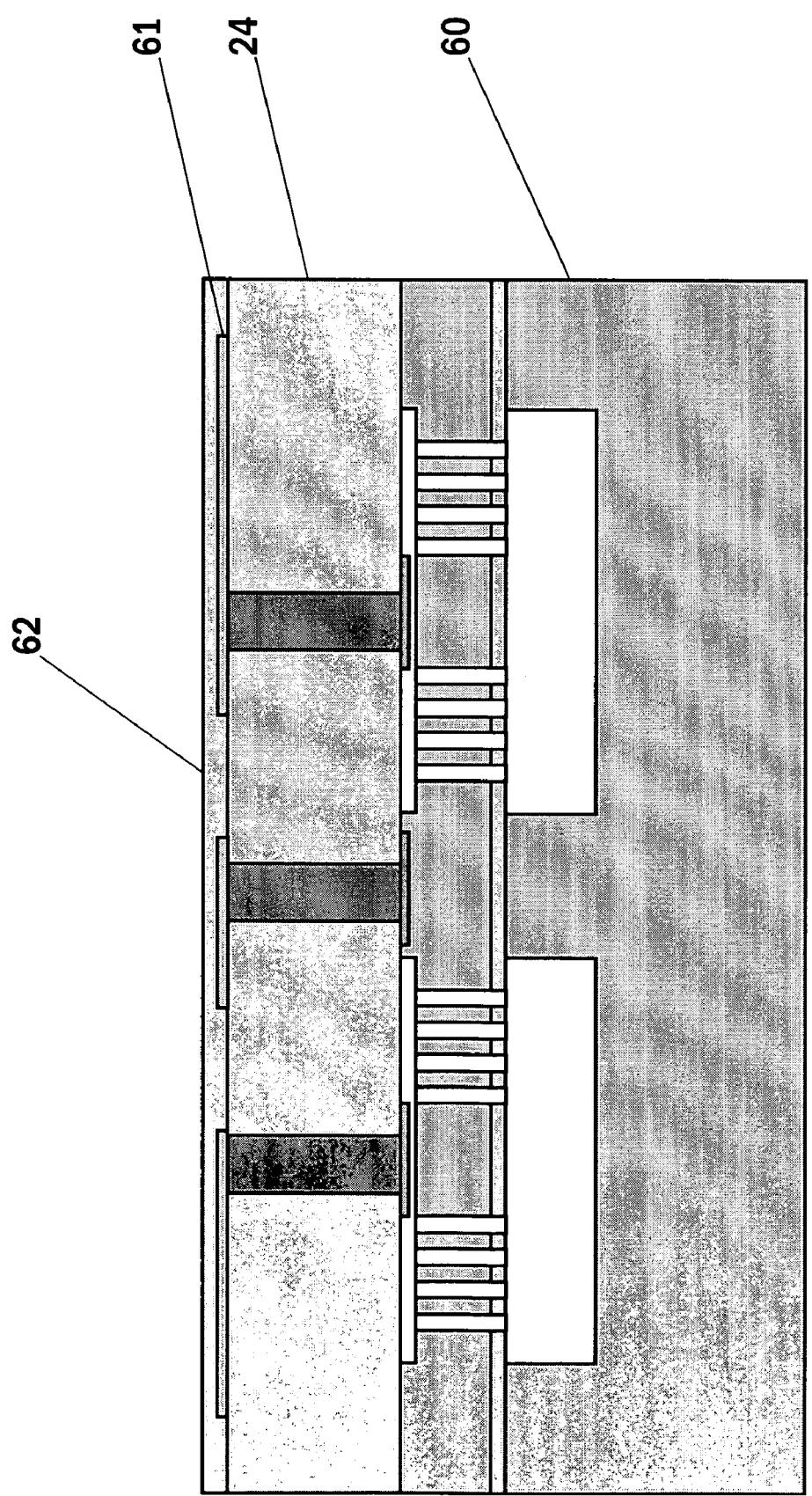
FIG. 15 shows a sectional view of dielectric layer solution of a cover part of a microelectromechanical component solution according to the invention.

FIG. 15 shows a sectional view of an isolation layer structure of the cover part of a microelectromechanical component solution according to the invention. In the solution according to the invention, the microelectromechanical chip part 60 has been sealed by a cover part 24, on the surface of which cover part 24 a conductive redistribution layer 61 has been manufactured.

Further, a dielectric layer 62 is manufactured on top of the redistribution layer comprising the external contact areas 61 of the cover part of the microelectromechanical component solution according to the invention. The dielectric layer 62 typically covers the entire surface of the cover part of the microelectromechanical component solution. The dielectric layer 62 of the microelectromechanical component solution can also serve as an adhesive layer for attaching the electronic circuit part.

The lead-in structures of the cover part 24, 28, 33, 41, 47, 48 sealing the microelectromechanical chip part 46, 60, according to the invention, can be implemented on the top surface of the cover part 24, 28, 33, 41, 47, 48 such, that the external contact areas of the cover part extend all the way to the edges of the microelectromechanical component. Thus, no redistribution layer is needed, and the dielectric layer 62 can be manufactured directly onto of the top surface of the cover part 24, 28, 33, 41, 47, 48.

Alternatively, the redistribution layer comprising the external contact areas 49-52, 53, 55, 57, 59, 61 of the cover part can be manufactured between the top surface of the cover part 24, 28, 33, 41, 47, 48 and the dielectric layer 62. The redistribution layer comprising the external contact areas 49-52, 53, 55, 57, 59, 61 of the cover part is manufactured either before the cover part 24, 28, 33, 41, 47, 48 of the microelectromechanical component solution is attached to the microelectromechanical chip part, or thereafter.

Figure 16:
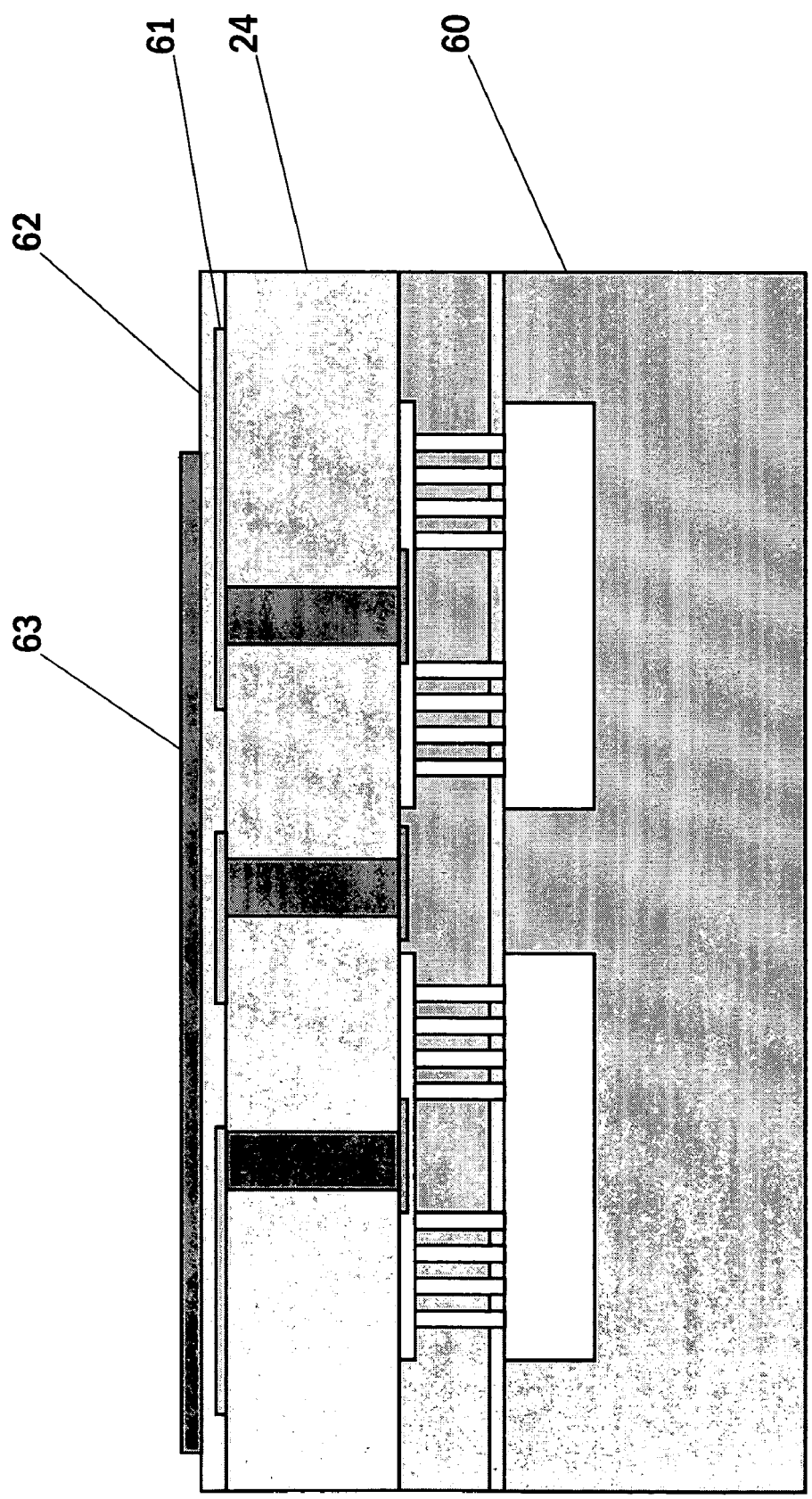
FIG. 16 shows a sectional view of an implementation of the microelectromechanical component solution according to the invention, whereby an electronic circuit part is attached on top of a microelectromechanical chip part.

FIG. 16 shows a sectional view of an implementation of the microelectromechanical component solution, according to the invention, whereby an electronic circuit part is attached on top of a microelectromechanical chip part. In the solution according to the invention, the microelectromechanical chip part 60 has been sealed by a cover part 24 containing lead-in structures for bringing electric connections through the cover part 24. A conductive redistribution layer 61 has been manufactured onto the surface of the cover part 24, and thereafter a dielectric layer 62.

In the microelectromechanical component solution, according to the invention, the electronic circuit part 63 is attached onto the surface of the cover part 24 protecting the microelectromechanical chip part 60 such, that the electronic circuit part 63 is fastened to the dielectric layer 62. In the microelectromechanical component solution according to the invention, the dielectric layer 62 isolates the electronic circuit part 63. The dielectric layer 62 can also serve as an adhesive layer for attaching the electronic circuit part 63. Alternatively, a separate adhesive layer can be used in attaching the electronic circuit part 63.

Figure 17:
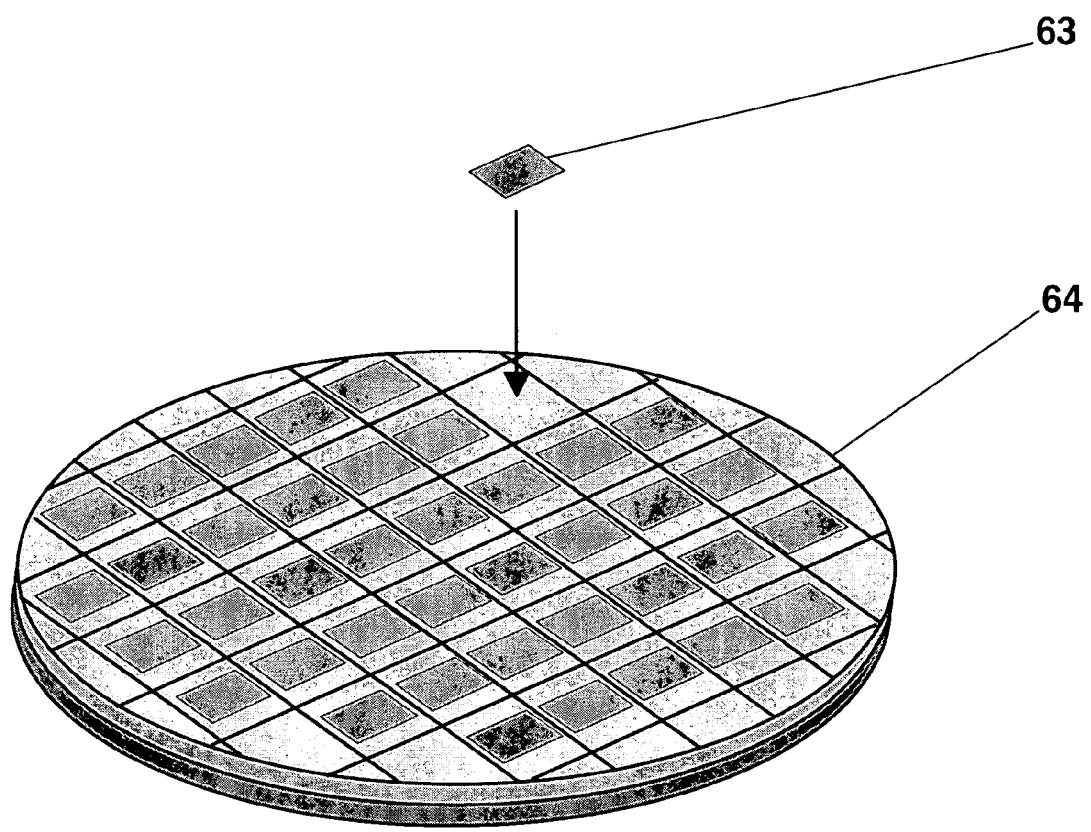
FIG. 17 shows a projection view of a wafer level implementation of the microelectromechanical component solution according to the invention, whereby an electronic circuit part is attached on top of a microelectromechanical chip part.

FIG. 17 shows a sectional view of the wafer level implementation of the microelectromechanical component solution according to the invention by attaching the electronic circuit part onto the microelectromechanical chip part. In the microelectromechanical component solution according to the invention, the microelectromechanical chip parts 60 located on the wafer are sealed by a cover part wafer to form a single wafer element 64.

Each electronic circuit part 63 is attached at the wafer level to the surface of the cover part 24 protecting the microelectromechanical chip parts 60 such, that the electronic circuit part 63 is fastened to the dielectric layer 62 of the wafer element 64. In the microelectromechanical component solution according to the invention, the electronic circuit parts 63 to be attached are extremely thin, having a thickness of about 20 µm. Subsequently, the electronic circuit parts 63 of the microelectromechanical component solution can be protected, at the wafer level, by a dielectric layer.

Figure 18:
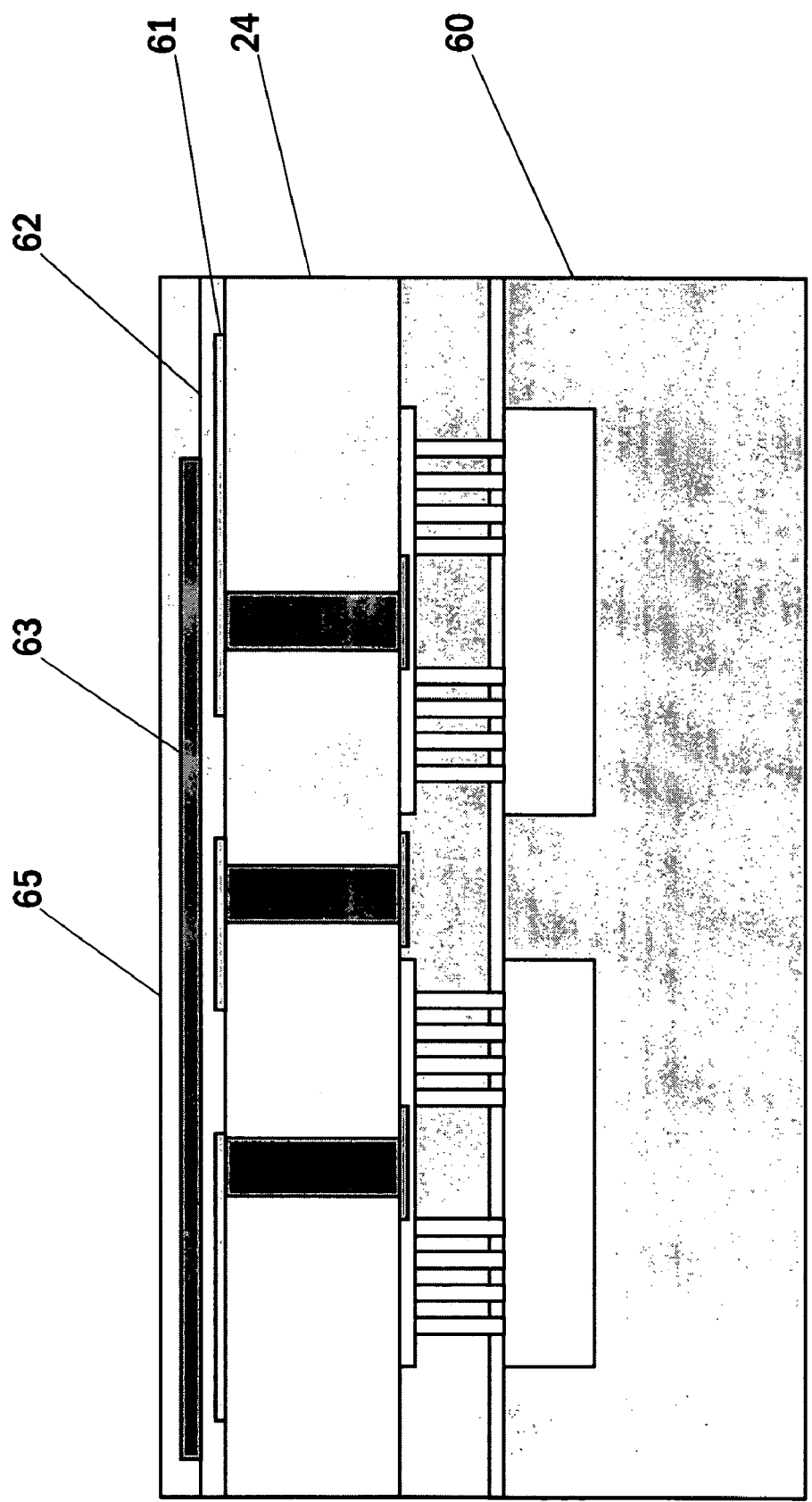
FIG. 18 shows a sectional view of an implementation, by means of a dielectric layer, of protecting an electronic circuit part of a microelectromechanical component solution according to the invention.

FIG. 18 shows a sectional view of an implementation of the protection of an electronic circuit part of the microelectromechanical component solution, according to the invention, by means of a dielectric layer. In the solution according to the invention, the microelectromechanical chip part 60 has been sealed by the cover part 24. On the surface of the cover part 24, a conductive redistribution layer 61 and a dielectric layer 62 have been manufactured, and subsequently the electronic circuit part 63 has been attached on the surface of the dielectric layer 62 isolating the cover part 24.

Further, on top of the electronic circuit part 63 of the cover part 24 of the microelectromechanical component solution according to the invention, a dielectric layer 65 covering the circuit wafer is manufactured. The dielectric layer 65 adjacent to the electronic circuit part typically covers the entire surface of the microelectromechanical component solution.

Figure 19:
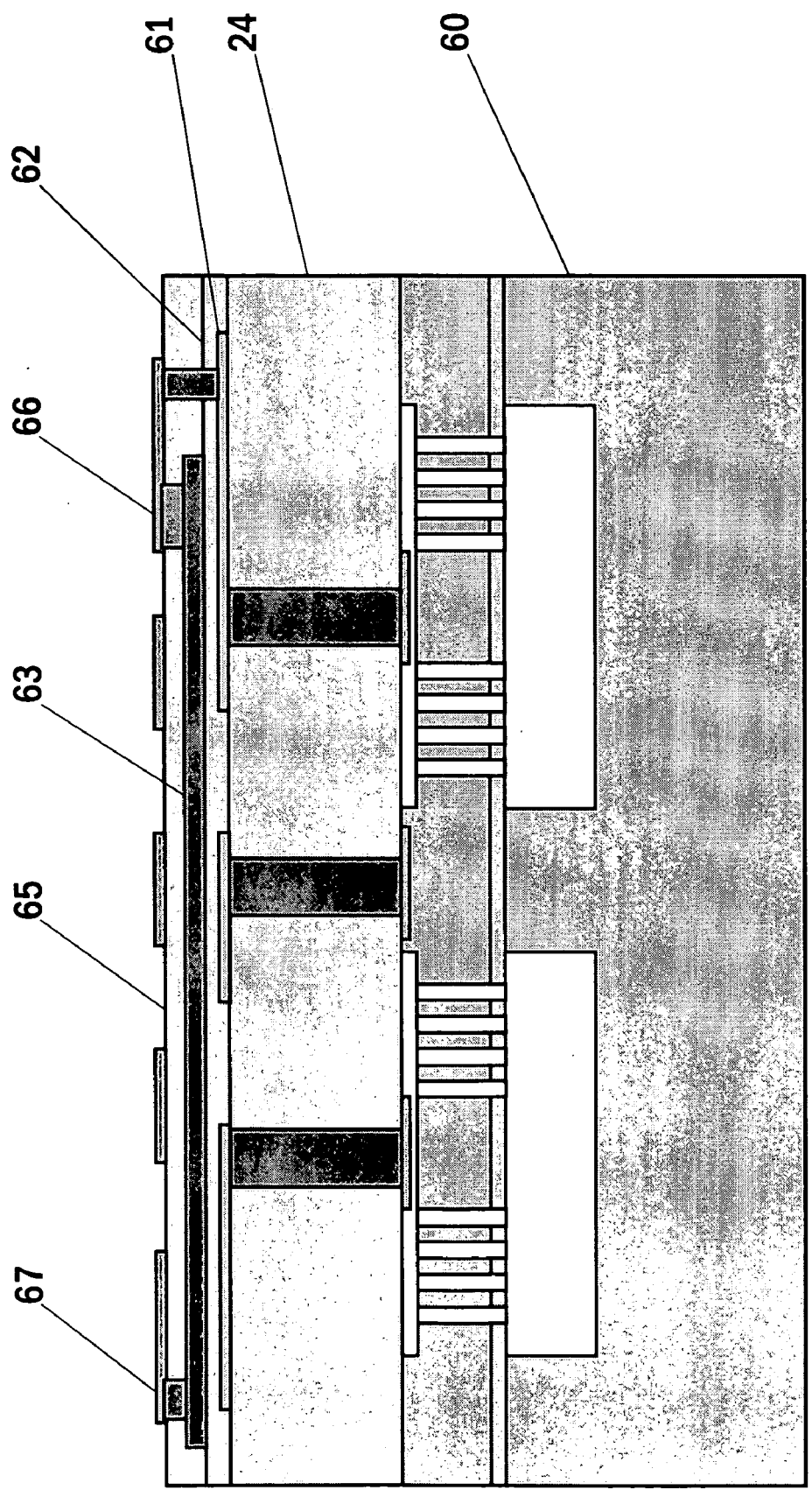
FIG. 19 shows a sectional view of an implementation of the wiring of an electronic circuit part of a microelectromechanical component solution according to the invention.

FIG. 19 shows a sectional view an implementation of the wiring of the electronic circuit part of the microelectromechanical component solution according to the invention. In the solution according to the invention the microelectromechanical chip part 60 has been sealed by a cover part 24. Onto the surface of the cover part 24, a conductive redistribution layer 61 and a dielectric layer 62 have been manufactured, and subsequently an electronic circuit part 63 has been attached on the surface of the dielectric layer 62 of the cover part 24 and then covered by a dielectric layer 65 covering the circuit wafer.

In the microelectromechanical component solution according to the invention, into the dielectric layer 65, lead-ins 66, 67 for the wirings are manufactured, said lead-ins extending suitably to the external contact areas of the cover part and to the electronic circuit part 63. Subsequently, a wiring layer is manufactured on top of the dielectric layer 65 and to the lead-ins 66, 67. By means of the wiring in the wiring layer to be implemented to the lead-ins 66, a conductive connection is created between the conductive areas 25-27, 29-31, 34-36, 42-44 of the cover part and the electronic circuit part 63 first to be attached on top of the microelectromechanical chip part 46, 60. By means of the wiring in the wiring layer to be implemented to the lead-ins 67, a conductive connection is also created for connecting the electronic circuit part 63 first to be attached on top of the microelectromechanical chip part 46, 60.

Figure 20:
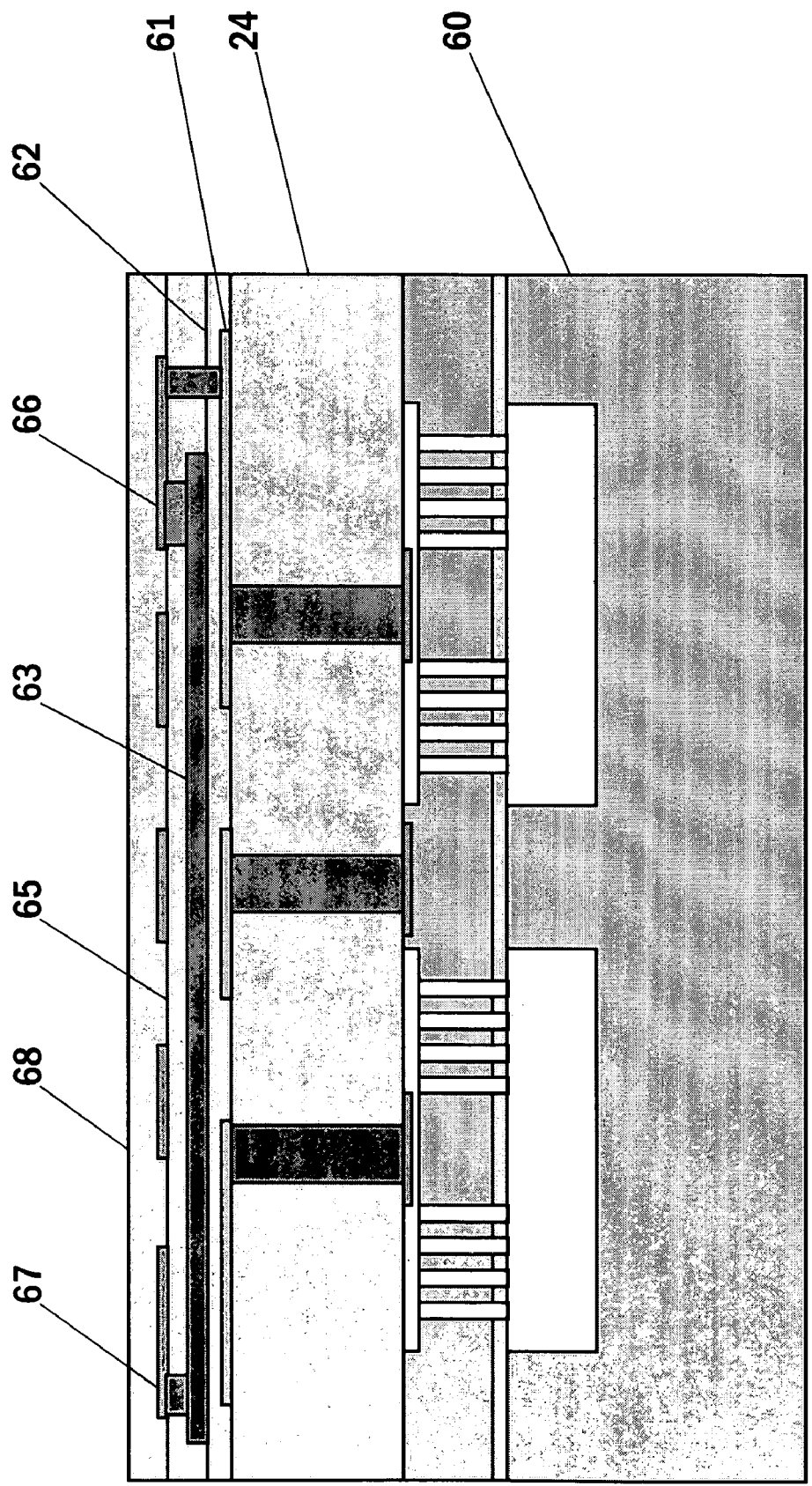
FIG. 20 shows a sectional view of an implementation of protecting the wiring of an electronic circuit part of a microelectromechanical component solution according to the invention.

FIG. 20 shows a sectional view of the implementation of the protection of the wiring of the electronic circuit part of the microelectromechanical component solution according to the invention. In the solution according to the invention, the microelectromechanical chip part 60 has been sealed by a cover part 24. Onto the surface of the cover part 24, a conductive redistribution layer 61 and a dielectric layer 62 have been manufactured. On top of the dielectric layer 62 of the cover part 24, an electronic circuit part 63 has been attached and covered by a dielectric layer 65. Into the dielectric layer 65, lead-ins 66, 67 have been manufactured, and further, on top of the dielectric layer 65 and to the lead-ins 66, 67, a wiring layer has been manufactured.

On top of the electronic circuit part 63 of the cover part 24 of the microelectromechanical component solution according to the invention, a protection layer 68 protecting the lead-ins 66, 67 and the wiring layer is further manufactured. The protection layer typically covers the entire surface of the cover part of the microelectromechanical component solution.

Figure 21:
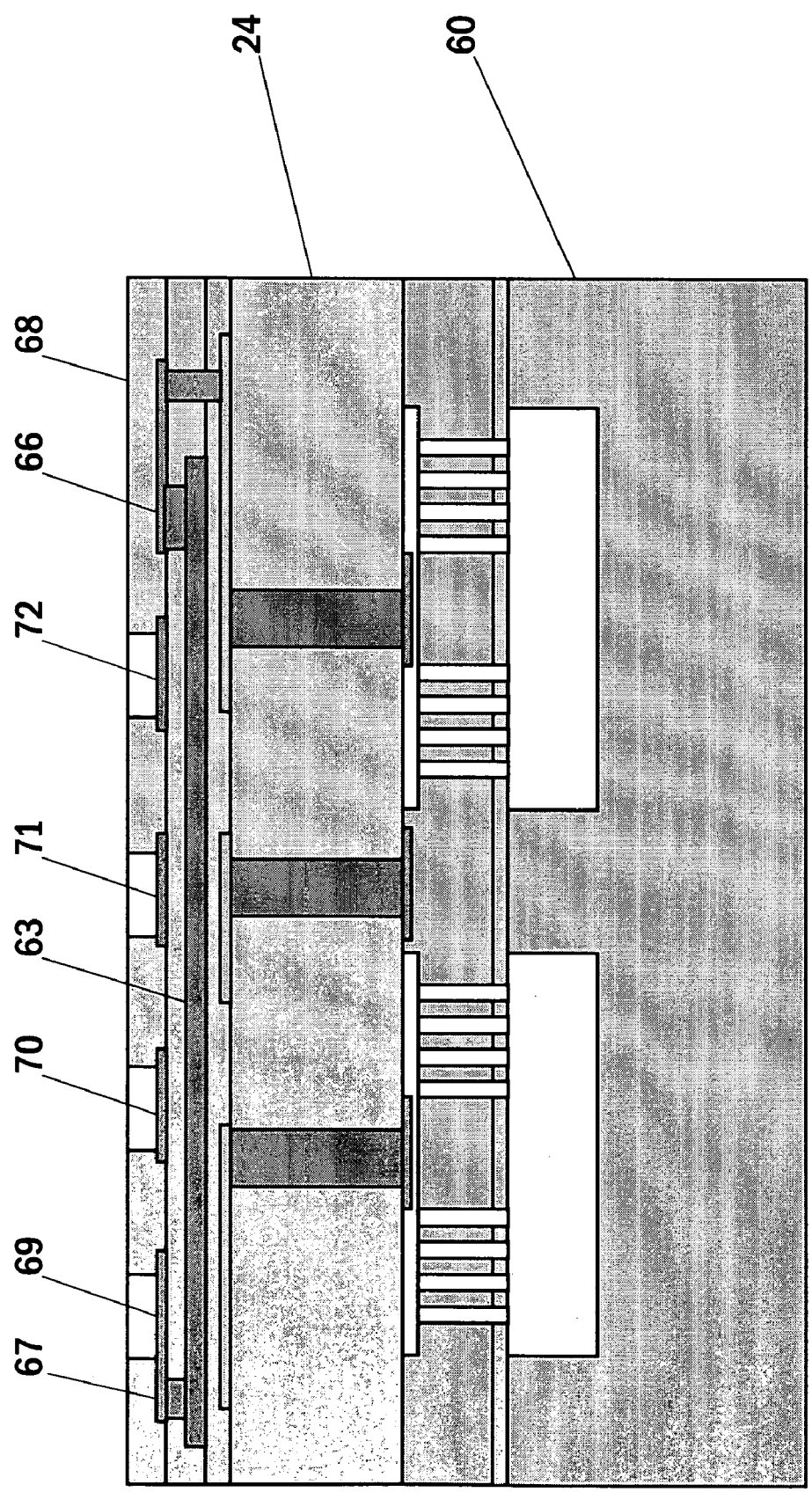
FIG. 21 shows a sectional view of an implementation of connection openings in an electronic circuit part of a microelectromechanical component solution according to the invention.

FIG. 21 shows a sectional view of an implementation of the connection openings for the electronic circuit part of the microelectromechanical component solution according to the invention. In the solution according to the invention, the microelectromechanical chip part 60 has been sealed by a cover part 24. The electronic circuit part 63 has been attached onto the surface of the cover part 24 and covered by a dielectric layer. Into the dielectric layer, lead-ins 66, 67, a wiring layer and a protection layer 68 have been manufactured.

In the microelectromechanical component solution according to the invention, into the protection layer 68, openings 69-72 are manufactured for bonding members, such as connector bumps, which openings suitably extend to the contact surfaces of the wiring layer.

Figure 22:
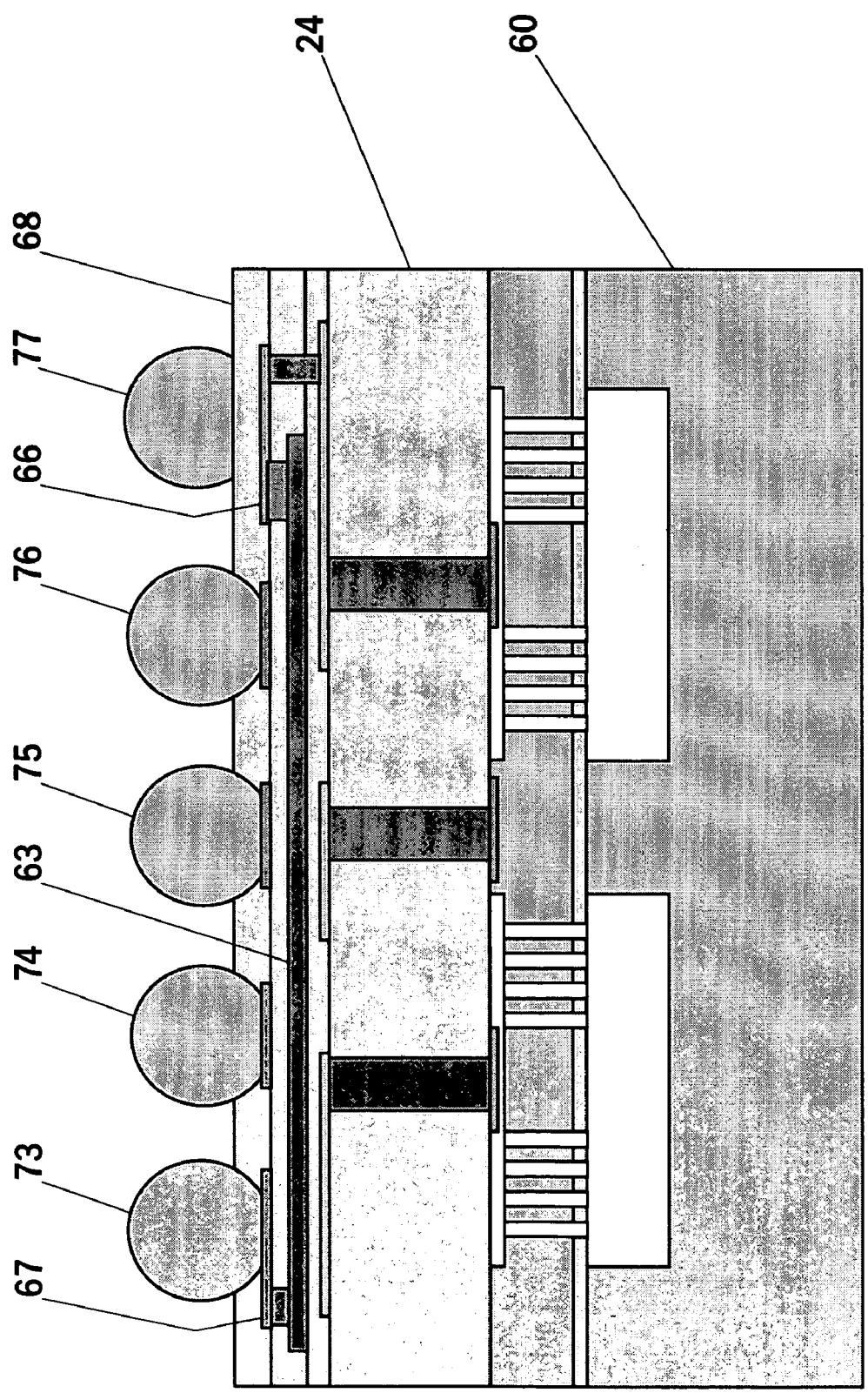
FIG. 22 shows a projection view of an exemplifying implementation of the structure of a microelectromechanical component solution according to the invention.

FIG. 22 shows a sectional view of an exemplifying implementation of the structure of the microelectromechanical component solution according to the invention. In the solution according to the invention, the microelectromechanical chip part 60 has been sealed by a cover part 24. The electronic circuit part 63 has been attached onto the surface of the cover part 24 and covered by a dielectric layer. Into the dielectric layer, lead-ins 66, 67, a wiring layer and a protection layer 68 have been manufactured. In the protection layer 68, openings 69-72 for connector bumps have been manufactured, the openings extending to the contact surfaces of the wiring layer.

In the microelectromechanical component solution according to the invention, connector bumps 73-77 for the external connections of the microelectromechanical component are manufactured into the openings 69-72 of the protection layer 68. In the figure, the opening of the protection layer 68 corresponding to the connector bump 77 is not shown. In the bump connector solution of the microelectromechanical component according to the invention, the external connections of the microelectromechanical component containing the microelectromechanical chip part 60 and the electronic circuit part 63 have been implemented by means of the bump connectors 73-77.

When the bump connectors 73-77 are manufactured into the microelectromechanical component solution according to the invention, a microelectromechanical component suitable for a soldering process is obtained without any separate encapsulation.

Figure 23:
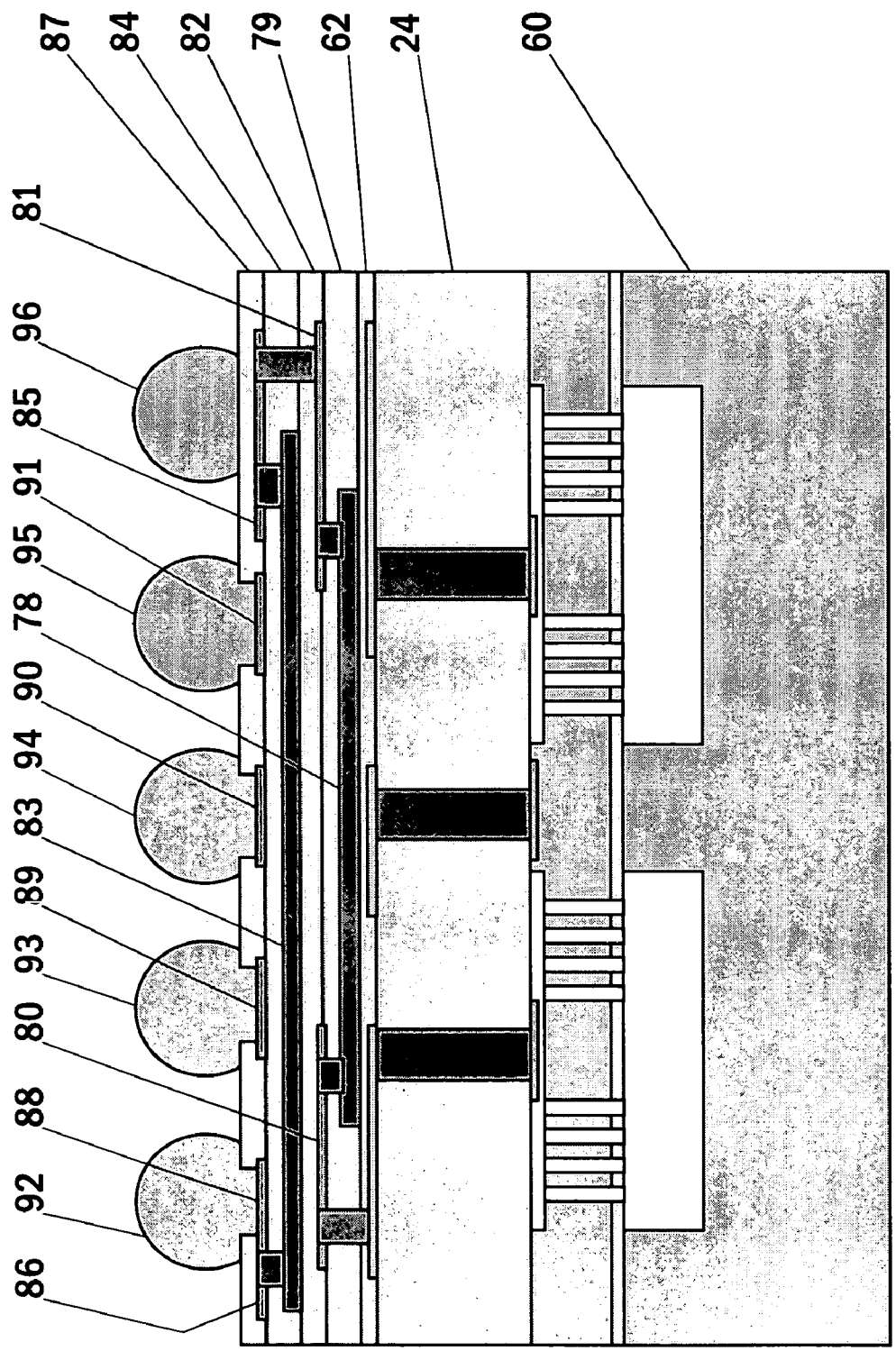
FIG. 23 shows a sectional view of an exemplifying implementation of an alternative structure of a microelectromechanical component solution according to the invention.

FIG. 23 shows a sectional view of an exemplifying implementation of an alternative structure of the microelectromechanical component solution according to the invention. In solution according to the invention, the microelectromechanical chip part 60 has been sealed by a cover part 24 containing lead-in structures for bringing electric connections through the cover part 24. Onto the surface of the cover part 24, a redistribution layer 61 has been manufactured, and thereafter a dielectric layer 62.

In the alternative structure of the microelectromechanical component solution according to the invention, a first electronic circuit part 78 is attached onto the surface of the cover part 24 protecting the microelectromechanical chip part 60 such, that the first electronic circuit part 78 gets fastened to the dielectric layer 62. In the alternative structure of the microelectromechanical component solution according to the invention, the dielectric layer 62 isolates the first electronic circuit part 78. The dielectric layer 62 can also serve as an adhesive layer for attaching the first electronic circuit part 78. Alternatively, a separate adhesive layer can be used in attaching the first electronic circuit part 78.

In the alternative structure of the microelectromechanical component solution according to the invention, a dielectric layer 79 is manufactured on top of the first electronic circuit part 78 of the cover part 24. The dielectric layer 79 typically covers the whole surface of the cover part of the microelectromechanical component solution. Into the dielectric layer 79, lead-ins 80, 81 suitably extending to the external contact areas of the cover part and to the first electronic circuit part 78 are manufactured for the wirings. Thereafter, on top of the dielectric layer 79 and to the lead-ins 80, 81, a wiring layer is manufactured. By means of the wiring in the wiring layer implemented to the lead-ins 80, a conductive connection is created between the conductive areas 25-27, 29-31, 34-36, 42-44 of the cover part and the electronic circuit part 78 first to be attached onto the microelectromechanical chip part 46, 60. By means of the wiring of the wiring layer implemented to the lead-ins 81, a conductive connection is also created for connecting the electronic circuit part 78 first to be attached onto the microelectromechanical chip part 46, 60.

In the alternative structure of the microelectromechanical component solution according to the invention, a dielectric layer 82 sandwiched between circuit parts is further manufactured on top of the lead-ins 80, 81 and the wiring layer. The dielectric layer 82 sandwiched between circuit parts typically covers the entire surface of the cover part of the microelectromechanical component solution.

In the alternative structure of the microelectromechanical component solution according to the invention, a second electronic circuit part 83 is also attached onto the surface of the cover part 24 protecting the microelectromechanical chip part 60 such, that the second electronic circuit part 83 gets fastened to the dielectric layer 82. In the alternative structure of the microelectromechanical component solution according to the invention, the dielectric layer 82 sandwiched between circuit parts isolates the second electronic circuit part 83. The dielectric layer 82 sandwiched between circuit parts can also serve as an adhesive layer for attaching the second electronic circuit part 83. Alternatively, a separate adhesive layer can be used in attaching the second electronic circuit part 83.

In the alternative structure of the microelectromechanical component solution according to the invention, a dielectric layer 84 is manufactured on top of the second electronic circuit part 83. The dielectric layer 84 typically covers the whole surface of the cover part of the microelectromechanical component solution. Into the dielectric layer 84, lead-ins 85, 86 for new wirings are manufactured suitably extending to the lead-in 81 of the wiring layer and to the second electronic circuit part 83. Thereafter a wiring layer is manufactured on top of the dielectric layer 84 and to the lead-ins 85, 86. A conductive connection between the previously attached electronic circuit part 78 and the electronic circuit part 83 to be attached to the dielectric layer 82 is created by means of the wiring of the wiring layer to be implemented to the lead-ins 85. A conductive connection for connecting the electronic circuit part 83 to be attached to the dielectric layer 82 is also created by means of the wiring of the wiring layer to be implemented to the lead-ins 86.

Further, lead-ins 85, 86 and a protection layer 87 protecting the wiring layer are manufactured on top of the second electronic circuit part 83. The protection layer 87 typically covers the whole surface of the cover part of the microelectromechanical component solution. In the structure of the microelectromechanical component solution according to the invention, also three or more electronic circuit parts can be used instead of the one electronic circuit part 63 or the two electronic circuit parts 78, 83.

In the alternative structure of the microelectromechanical component solution according to the invention, openings 88-91, for bonding members, such as connector bumps, the openings suitably extending to the contact surfaces of the wiring layer, are manufactured into the protection layer 87 located on the second electronic circuit part 83.

In the alternative structure of the microelectromechanical component solution according to the invention, connector bumps 92-96 for the external connections of the microelectromechanical component are manufactured into the openings 88-91 in the protection layer. The opening in the protection layer 68 corresponding to the connector bump 96 is not shown in the figure. In the microelectromechanical component's bump connector solution according to the invention, the external connections of the microelectromechanical component containing the microelectromechanical chip part 60 and the two electronic circuit parts 78, 83 are implemented by means of the bump connectors 92-96.

When, in the microelectromechanical component solution according to the invention, the bump connectors 92-96 are manufactured into the microelectromechanical component, a microelectromechanical component suitable for a soldering process is obtained without any separate encapsulation. In the microelectromechanical component solution according to the invention, also three or more electronic circuit parts can be used instead of the one electronic circuit part 63 or the two electronic circuit parts 78, 83.

In the microelectromechanical component solution according to the invention, the dielectric layers and the protection layers 62, 65, 68, 79, 82, 84, 87 serve well as protection against various harmful agents coming from the environment, such as dampness. Since the electrically sensitive areas of the electronic circuit part 63, 78, 83 and the microelectromechanical chip part 46, 60 are protected by means of the dielectric and the protection layers 62, 65, 68, 79, 82, 84, 87, the microelectromechanical component can be used without a plastic cast capsule, if desired. However, a plastic cast capsule can be cast over the unit consisting of the microelectromechanical component solution according to the invention, if so desired. The capsule structure of the microelectromechanical component can suitably be designed to be compatible with a microelectromechanical component containing a microelectromechanical chip part 46, 60 and an electronic circuit part 63, 78, 83.

In the microelectromechanical component solution according to the invention, the microelectromechanical component containing a microelectromechanical chip part 46, 60 and an electronic circuit part 63, 78, 83 can be connected to the outside by means of any known connection solution. Such connection solutions are wire connections, bump connections, adhesive connections, conductive adhesive connections, anisotropic adhesive connections, or a direct soldering joint solution.

A microelectromechanical component, manufactured by means of the method according to the invention, also includes electrical signal processing capability. By means of the invention, a microelectromechanical component solution is provided, in which electric functions in an advantageous manner have been integrated in connection with a microelectromechanical component solution, and which also is well suited for use, in particular, in small microelectromechanical motion sensor solutions, pressure sensor solutions, other sensor solutions, oscillation frequency stabilization solutions, electrical signal filtering solutions, electrical signal switching solutions and electric impedance matching solutions.

The invention is well suited for use in various microelectromechanical components, such as, for example microelectromechanical measuring instruments to be used in measuring or detecting acceleration, angular acceleration, angular velocity, pressure, a magnetic field, temperature or other physical quantities. By means of the solution according to the invention, the analysis of the measuring activity of the sensor can be implemented in the microelectromechanical sensor itself.

By means of the microelectromechanical component solution according to the invention using several electronic circuit parts 63, 78, 83, distributing electrical functions of different types to separate electronic circuit parts 63, 78, 83 can be conveniently implemented. For example, analog components, processor components, memory components, or radio frequency components can be positioned each in their own electronic circuit part 63, 78, 83. In the microelectromechanical component solution according to the invention, sensor functions can be positioned onto one or more electronic circuit part 63, 78, 83 in a monolithically integrated manner. In the microelectromechanical component solution according to the invention, shielding against electromagnetic interference (EMI) can also conveniently be implemented by positioning the components causing interference and the components sensitive to interference onto separate electronic circuit parts 63, 78, 83. Thus, a separate EMI shielding layer can be added between the electronic circuit parts 63, 78, 83, if desired.

In the microelectromechanical component solution according to the invention, antenna components of the sensor can also conveniently be positioned onto an electronic circuit part or electronic circuit parts 63, 78, 83 of their own. Also, sending antenna components and receiving antenna components can be positioned onto separate electronic circuit parts 63, 78, 83. Thus, between electronic circuit parts 63, 78, 83 comprising sending antenna components and receiving antenna components, for example, an antenna ground layer can be provided, if desired.

By means of the microelectromechanical component solution according to the invention, a pressure sensor, or an angular acceleration, angular velocity, or a linear motion sensor measuring in three directions, for example, can be implemented. A sensor according to the invention measuring, in three directions, angular acceleration, angular velocity, or linear motion, can thus comprise several microelectromechanical components, each measuring in a different direction.

By means of the microelectromechanical component solution according to the invention, also an IMU motion measuring instrument unit (Inertia Measurement Unit) can be implemented. The microelectromechanical IMU motion measuring instrument unit according to the invention can comprise a multitude of microelectromechanical components, like for example, an angular velocity sensor component, an acceleration sensor component, and a sensor component measuring or detecting the strength of a magnetic field.

By means of the microelectromechanical component solution according to the invention, also an inclination compensated compass can be implemented. The inclination compensated compass, according to the invention, can comprise an acceleration sensor measuring in relation to two or three axes, and a sensor measuring or detecting a magnetic field, implemented in association with an electronic circuit part, which sensor may be based on a magneto-resistive, a magneto-inductive, a flux-gate, a Hall, or some other known magnetic field measuring principle.

By means of the microelectromechanical component solution according to the invention, also a remotely controlled microelectromechanical sensor component can be implemented. The remotely controlled microelectromechanical sensor component, according to the invention, can also, in addition to the sensor unit, comprise sending means and receiving means for, for example, sending measurement data and receiving instructions and calibration data.

The invention is well suited for use also in oscillators and frequency synthesizers used for generating and stabilizing an oscillation frequency, and in components, in which one desires to add to a function implemented by means of an electric circuit, such as a high frequency or intermediate frequency part of a radio device, microelectromechanical parts, such as resonators, filters, switches, or impedance matching elements, and in other microelectromechanical devices, in which one desires to combine microelectromechanical parts, located in a sealed space, with parts implemented by means of a microcircuit. By means of the invention, an improved method can be provided for manufacturing a microelectromechanical component, as well as a microelectromechanical component, which is particularly well suited for use in small microelectromechanical sensor solutions, solutions for stabilizing frequency of oscillation, electrical signal filtering solutions, electrical signal switching solutions, and electric impedance matching solutions.

In a microelectromechanical component manufactured by means of a method according to the invention, the mechanical and the electrical bonding of a microelectromechanical chip part and electronic circuit parts to each other can be implemented in a preferable manner by using a cover wafer of a specific kind, so that, in the manufacturing, the microelectromechanical wafer serves as a substrate for installing the electronic circuit parts and the connections between the parts remain protected from the environment.

In the method according to the invention, the electronic circuit parts can, for example, be installed one by one onto the surface of a microelectromechanical wafer provided with a cover. One can thus ensure, that only electronic circuit parts having passed testing are installed only in locations containing microelectromechanical chips having passed testing. In the method according to the invention, the microelectromechanical wafer is only diced after the installation stages and the final testing.

We claim:

1. A method for manufacturing a microelectromechanical component, in which method a microelectromechanical chip part is sealed by a cover part, which cover part contains lead-in structures for bringing electric connections through the cover part characterized in, that
on top of said microelectromechanical chip part sealed by the cover part at least one electronic circuit part is attached, layer by layer, and that
bonding members are manufactured onto the surface of the topmost electronic circuit part for external connections of the microelectromechanical component.

2. Method according to claim 1, characterized in, that the cover part is mainly made of glass, such that, into the cover part, conductive areas extending through the glass element are manufactured out of silicon.

3. Method according to claim 1, characterized in, that the cover part is mainly made of silicon, and into which cover part glass insulation is manufactured, such that, into the cover part, conductive areas extending through the glass insulation are manufactured out of silicon.

4. Method according to claim 1, characterized in, that the cover part is mainly made of silicon, and into which cover part glass insulators are manufactured, such that the cover part is divided into strip-like conductive areas.

5. Method according to claim 1, characterized in, that the cover part is mainly made of silicon, and into which cover part glass insulation is manufactured, such that the cover part is divided into insular conductive areas.

6. Method according to claim 2, characterized in, that the cover part and/or the glass insulators are made of some other known dielectric material instead of glass.

7. Method according to claim 2, characterized in, that the cover part and/or the conductive areas, are made of some other known conductive material instead of silicon.

8. Method according to claim 1, characterized in, that the formation of an electric connection between the conductive lead-in of the cover part and the microelectromechanical chip part is implemented by means of a direct bond.

9. Method according to claim 1, characterized in, that the formation of an electric connection between the conductive lead-in of the cover part and the microelectromechanical chip part is implemented by means of metal layers located on the surface.

10. Method according to claim 1, characterized in, that the formation of an electric connection between the conductive lead-in of the cover part and the microelectromechanical chip part is implemented by means of a soldering bump.

11. Method according to claim 1, characterized in, that lead-ins on the top surface of the cover part sealing the microelectromechanical chip part are implemented such, that the external contact areas of the cover part extend all the way to the edges of the microelectromechanical component.

12. Method according to claim 1, characterized in, that a dielectric layer is manufactured onto the top surface of the cover part.

13. Method according to claim 12, characterized in, that, before attaching the cover part to the microelectromechanical chip part, a redistribution layer comprising the external contact areas of the cover part is manufactured between the top surface of the cover part and the dielectric layer (62).

14. Method according to claim 12, characterized in, that, after attaching the cover part to the microelectromechanical chip part, a redistribution layer comprising the external contact areas of the cover part is manufactured between the top surface of the cover part and the dielectric layer.

15. Method according to claim 13, characterized in, that a dielectric layer isolating the cover part is manufactured between the redistribution layer comprising the external contact areas of the cover part and the cover part.

16. Method according to claim 12, characterized in, that said electronic circuit part is attached on top of the dielectric layer.

17. Method according to claim 16, characterized in, that the dielectric layer serves as an adhesive layer for attaching the electronic circuit part.

18. Method according to claim 16, characterized in, that a separate adhesive layer is used in attaching the electronic circuit part.

19. Method according to claim 17, characterized in, that a dielectric layer covering the circuit wafer is manufactured on top of the electronic circuit part.

20. Method according to claim 11, characterized in, that lead-ins extending to the external contact areas, of the cover part and to the electronic circuit part are manufactured into the dielectric layer covering the circuit wafer.

21. Method according to claim 20, characterized in, that, to the lead-ins, a wiring layer is implemented, by means of the wiring of which a conductive connection is created between the conductive areas of the cover part and the electronic circuit part first to be attached on top of said microelectromechanical chip part.

22. Method according to claim 20, characterized in, that, to the lead-ins, a wiring layer is implemented, by means of the wiring of which a conductive connection is created for connecting the electronic circuit part first to be attached on top of said microelectromechanical chip part.

23. Method according to claim 22, characterized in, that attaching the at least one electronic circuit part on top of said microelectromechanical chip part sealed by the cover part is implemented by performing he following series of actions at least once:
- a dielectric layer is manufactured on top of the dielectric layer covering the circuit wafer,
- said electronic circuit part is attached on top of the dielectric layer,
- a dielectric layer covering the circuit wafer is manufactured on top of the electronic circuit part, and
- a lead-ins extending to the wiring layer implemented to the lead-ins and to the electronic circuit part are manufactured into the dielectric layer covering the circuit wafer.

24. Method according to claim 23, characterized in, that the dielectric layer serves as an adhesive layer for attaching the electronic circuit part.

25. Method according to claim 23, characterized in, that a separate adhesive layer is used in attaching the electronic circuit part.

26. Method according to claim 23, characterized in, that, to the lead-ins, a wiring layer is implemented, by means of the wiring of which a conductive connection is created between the previously attached electronic circuit part and the electronic circuit part to be attached to the dielectric layer.

27. Method according to claim 23, characterized in, that to the lead-ins a wiring layer is implemented, by means of the wiring of which a conductive connection is created for connecting the electronic circuit part to be attached to the dielectric layer.

28. Method according to claim 22, characterized in, that a protection layer is manufactured on top of the wiring layer implemented to the lead-ins.

29. Method according to claim 28, characterized in, that, into the protection layer, openings suitably extending to the contact surfaces of the wiring layer implemented to the lead-ins are manufactured for bonding members to be manufactured for the external connections of the microelectromechanical component.

30. Method according to claim 29, characterized in, that the bonding members to be manufactured for the external connections of the microelectromechanical component are implemented by means of wire connections.

31. Method according to claim 30, characterized in, that a plastic cast capsule is cast over the microelectromechanical component.

32. Method according to claim 29, characterized in, that the bonding members to be manufactured for the external connections of the microelectromechanical component are implemented by means of bump connectors.

33. Method according to claim 29, characterized in, that the bonding members to be manufactured for the external connections of the microelectromechanical component are implemented by means of adhesive joints.

34. Method according to claim 29, characterized in, that the bonding members to be manufactured for the external connections of the microelectromechanical component are implemented by means of direct soldering joints.

35. Method according to claim 33, characterized in, that the bonding members form a conductive connection to the capsule structure of the microelectromechanical component, said capsule structure being provided with conductive coatings.

36. Method according to claim 33, characterized in, that the capsule structure of the microelectromechanical component is suitably designed to match the microelectromechanical component.

37. Method according to claim 1, characterized in, that the electronic circuit parts of the microelectromechanical component possesses electrical signal processing capability.

38. Method according to claim 1, characterized in, that electrical functions of different types have been distributed onto separate electronic circuit parts.

39. Method according to claim 1, characterized in, that components causing interference and components sensitive to interference have been positioned on separate electronic circuit parts.

40. Method according to claim 1, characterized in, that a separate EMI shielding layer has been added between the electronic circuit parts.

41. Method according to claim 1, characterized in, that antenna components have been positioned on separate electronic circuit parts.

42. Method according to claim 41, characterized in, that sending antenna components and receiving antenna components have been positioned on separate electronic circuit parts.

43. Method according to claim 41, characterized in, that an antenna ground layer have been positioned between the electronic circuit parts comprising the antenna components.

44. Method according to claim 1, characterized in, that the electronic circuit parts of the microelectromechanical component contain sensor functions for measuring physical quantities.

45. Method according to claim 44, characterized in, that the electronic circuit parts contain circuit structures for detecting a magnetic field.

46. Method according to claim 44, characterized in, that the electronic circuit parts contain circuit structures for detecting temperature.

47. Method according to claim 1, characterized in, that a wafer-like substrate comprising said microelectromechanical chip parts sealed by a cover part serves as a base for installing an electronic circuit part.

48. Method according to claim 47, characterized in, that a set of electronic circuit parts are installed, one by one, onto the surface of the wafer-like substrate comprising said microelectromechanical chip parts sealed by a cover part.

49. Method according to claim 48, characterized in, that only electronic circuit parts having passed testing are installed onto the surface of only said microelectromechanical chip parts sealed by a cover part having passed testing.

50. Method according to claim 47, characterized in, that the wafer-like substrate comprising a set of said microelectromechanical chip parts sealed by a cover part is diced only after the installation stages.

51. Method according to claim 47, characterized in, that the wafer-like substrate comprising a set of said microelectromechanical chip parts sealed by a cover part is diced only after final testing.

52. A microelectromechanical component comprising:
- a microelectromechanical chip part sealed by a cover part, which cover part contains lead-in structures for bringing electric connections through the cover part characterized in, that
- at least one electronic circuit part has been attached, layer by layer, on top of said microelectromechanical chip part sealed by a cover part and, that
- bonding members have been manufactured onto the surface of the topmost electronic circuit part for external connections of the microelectromechanical component.

53. Microelectromechanical component according to claim 52, characterized in, that the cover part is mainly made of glass, such that, into the cover part, conductive areas extending through the glass element have been manufactured out of silicon.

54. Microelectromechanical component according to claim 52, characterized in, that the cover part is mainly made of silicon, and into which cover part glass insulation has been manufactured, such that, into the cover part, conductive areas extending through the glass insulation have been manufactured out of silicon.

55. Microelectromechanical component according to claim 52, characterized in, that the cover part is mainly made of silicon, and into which cover part glass insulators have been manufactured, such that the cover part is divided into strip-like conductive areas.

56. Microelectromechanical component according to claim 52, characterized in, that the cover part is mainly made of silicon, and into which cover part glass insulation has been manufactured, such that the cover part is divided into insular conductive areas.

57. Microelectromechanical component according to claim 53, characterized in, that the cover part and/or the glass insulators are made of some other known dielectric material instead of glass.

58. Microelectromechanical component according to claim 53, characterized in, that the cover part and/or the conductive areas are made of some other known conductive material instead of silicon.

59. Microelectromechanical component according to claim 52, characterized in, that the formation of the electric connection between the conductive lead-in of the cover part and the microelectromechanical chip part has been implemented by means of a direct bond.

60. Microelectromechanical component according to claim 52, characterized in, that the formation of the electric connection between the conductive lead-in of the cover part and the microelectromechanical chip part has been implemented by means of metal layers located on the surface.

61. Microelectromechanical component according to claim 52, characterized in, that the formation of the electric connection between the conductive lead-in of the cover part and the microelectromechanical chip part has been implemented by means of a soldering bump.

62. Microelectromechanical component according to claim 52, characterized in, that the lead-in structures of the cover part sealing the microelectromechanical chip part have been implemented on the top surface of the cover part such, that the external contact areas of the cover part extend all the way to the edges of the microelectromechanical component.

63. Microelectromechanical component according to claim 52, characterized in, that a dielectric layer has been manufactured onto the top surface of the cover part.

64. Microelectromechanical component according to claim 63, characterized in, that the dielectric layer covers the entire surface of the cover part.

65. Microelectromechanical component according to claim 62, characterized in, that a redistribution layer comprising the external contact areas of the cover part has been manufactured between the top surface of the cover part and the dielectric layer.

66. Microelectromechanical component according to claim 65, characterized in, that a layer isolating the cover part has been manufactured between the redistribution layer comprising the external connection areas of the cover part and the cover part.

67. Microelectromechanical component according to claim 63, characterized in, that said electronic circuit part is attached on top of the dielectric layer.

68. Microelectromechanical component according to claim 63, characterized in, that a dielectric layer covering the circuit wafer has been manufactured on top of the electronic circuit part.

69. Microelectromechanical component according to claim 68, characterized in, that lead-ins extending to the external contact areas of the cover part and to the electronic circuit part have been manufactured into the dielectric layer covering the circuit wafer.

70. Microelectromechanical component according to claim 69, characterized in, that a wiring layer has been implemented to the lead-ins, by means of the wiring of which a conductive connection has been created between the conductive areas of the cover part and the electronic circuit part first to be attached onto said microelectromechanical chip part.

71. Microelectromechanical component according to claim 69, characterized in, that, to the lead-ins, a wiring layer has been implemented, by means of the wiring of which a conductive connection has been created for connecting the electronic circuit part first to be attached onto said microelectromechanical chip part.

72. Microelectromechanical component according to claim 71, characterized in, that attaching at least one electronic circuit part onto said microelectromechanical chip part sealed by a cover part has been implemented by performing the following series of operations at least once:
- a dielectric layer has been manufactured on top of the dielectric layer covering the circuit wafer,
- said electronic circuit part has been attached on top of the dielectric layer,
- a dielectric layer covering the circuit wafer has been manufactured on top of the electronic circuit part, and
- lead-ins extending to the wiring layer implemented to the lead-ins and to the electronic circuit part have been manufactured into the dielectric layer covering the circuit wafer.

73. Microelectromechanical component according to claim 72, characterized in, that the dielectric layer covers the entire surface of the cover part.

74. Microelectromechanical component according to claim 72, characterized in, that, to the lead-ins, a wiring layer has been implemented, by means of the wiring of which a conductive connection has been created between the previously attached electronic circuit part and the electronic circuit part to be attached onto the dielectric layer.

75. Microelectromechanical component according to claim 72, characterized in, that, to the lead-ins, a wiring layer has been implemented, by means of the wiring of which a conductive connection has been created for connecting the electronic circuit part to be attached onto the dielectric layer.

76. Microelectromechanical component according to claim 71, characterized in, that a protection layer has been manufactured on top of the wiring layer implemented to the lead-ins.

77. Microelectromechanical component according to claim 76, characterized in, that, into the protection layer openings suitably extending to the contact surfaces of the wiring layer implemented to the lead-ins have been manufactured for bonding members to be manufactured for the external connections of the microelectromechanical component.

78. Microelectromechanical component according to claim 77, characterized in, that the bonding members to be manufactured for the external connections of the microelectromechanical component have been implemented by means of wire connections.

79. Microelectromechanical component according to claim 78, characterized in, that a plastic cast capsule has been cast over the microelectromechanical component.

80. Microelectromechanical component according to claim 77, characterized in, that the bonding members to be manufactured for the external connections of the microelectromechanical component have been implemented by means of bump connectors.

81. Microelectromechanical component according to claim 77, characterized in, that the bonding members to be manufactured for the external connections of the microelectromechanical component have been implemented by means of adhesive joints.

82. Microelectromechanical component according to claim 77, characterized in, that the bonding members to be manufactured for the external connections of the microelectromechanical component have been implemented by means of direct soldering joints.

83. Microelectromechanical component according to claim 81, characterized in, that the bonding members form a conductive connection to the capsule structure of the microelectromechanical component, said capsule structure being provided with conductive coatings.

84. Microelectromechanical component according to claim 81, characterized in, that the capsule structure of the microelectromechanical component has been suitably designed to match the microelectromechanical component.

85. Microelectromechanical component according to claim 52, characterized in, that the electronic circuit parts of the microelectromechanical component possess electrical signal processing capability.

86. Microelectromechanical component according to claim 52, characterized in, that electrical functions of different types have been distributed onto separate electronic circuit parts.

87. Microelectromechanical component according to claim 52, characterized in, that components causing interference and components sensitive to interference are positioned on separate electronic circuit parts.

88. Microelectromechanical component according to claim 52, characterized in, that a separate EMI shielding layer has been added between the electronic circuit parts.

89. Microelectromechanical component according to claim 52, characterized in, that antenna components have been positioned on separate electronic circuit parts.

90. Microelectromechanical component according to claim 89 characterized in, that sending antenna components and receiving antenna components have been positioned on separate electronic circuit parts.

91. Microelectromechanical component according to claim 89, characterized in, that an antenna ground layer has been positioned between the electronic circuit parts comprising the antenna components.

92. Microelectromechanical component according to claim 52, characterized in, that the electronic circuit parts of the microelectromechanical component contain sensor functions for measuring physical quantities.

93. Microelectromechanical component according to claim 92, characterized in, that the electronic circuit parts contain circuit structures for detecting a magnetic field.

94. Microelectromechanical component according to claim 92, characterized in, that the electronic circuit parts contain circuit structures for detecting temperature.

95. A microelectromechanical acceleration sensor comprising:
a microelectromechanical chip part sealed by a cover part, which cover part contains lead-in structures for bringing electric connections through the cover part,
characterized in, that
at least one electronic circuit part has been attached, layer by layer, on top of said microelectromechanical chip part sealed by the cover part, and that
bonding members have been manufactured onto the surface of the topmost electronic circuit part for the external connections of the microelectromechanical component.

96. A microelectromechanical sensor of angular acceleration, comprising:
a microelectromechanical chip part sealed by a cover part, which cover part contains lead-in structures for bringing electric connections through the cover part,
characterized in, that
at least one electronic circuit part has been attached, layer by layer, on top of said microelectromechanical chip part sealed by the cover part, and that
bonding members have been manufactured onto the surface of the topmost electronic circuit part for the external connections of the microelectromechanical component.

97. A microelectromechanical sensor of angular velocity, comprising:
a microelectromechanical chip part sealed by a cover part, which cover part contains lead-in structures for bringing electric connections through the cover part,
characterized in, that
at least one electronic circuit part has been attached, layer by layer, on top of said microelectromechanical chip part sealed by the cover part, and that
bonding members have been manufactured onto the surface of the topmost electronic circuit part for the external connections of the microelectromechanical component.

98. A microelectromechanical pressure sensor comprising:
a microelectromechanical chip part sealed by a cover part, which cover part contains lead-in structures for bringing electric connections through the cover part,
characterized in, that
at least one electronic circuit part has been attached, layer by layer, on top of said microelectromechanical chip part sealed by the cover part, and that
bonding members have been manufactured onto the surface of the topmost electronic circuit part for the external connections of the microelectromechanical component.

99. A microelectromechanical IMU motion measuring instrument unit comprising:
a microelectromechanical chip part sealed by a cover part, which cover part contains lead-in structures for bringing electric connections through the cover part,
characterized in, that
at least one electronic circuit part has been attached, layer by layer, on top of said microelectromechanical chip part sealed by the cover part, and that
bonding members have been manufactured onto the surface of the topmost electronic circuit part for the external connections of the microelectromechanical component.

100. A microelectromechanical stabilizer of frequency of oscillation, comprising:

a microelectromechanical chip part sealed by a cover part, which cover part contains lead-in structures for bringing electric connections through the cover part, characterized in, that at least one electronic circuit part has been attached, layer by layer, on top of said microelectromechanical chip part sealed by the cover part, and that bonding members have been manufactured onto the surface of the topmost electronic circuit part for the external connections of the microelectromechanical component.

101. A microelectromechanical electrical signal filter comprising:

a microelectromechanical chip part sealed by a cover part, which cover part contains lead-in structures for bringing electric connections through the cover part, characterized in, that at least one electronic circuit part has been attached, layer by layer, on top of said microelectromechanical chip part sealed by the cover part, and that bonding members have been manufactured onto the surface of the topmost electronic circuit part for the external connections of the microelectromechanical component.

102. A microelectromechanical electrical signal switching component comprising:

a microelectromechanical chip part sealed by a cover part, which cover part contains lead-in structures for bringing electric connections through the cover part, characterized in, that at least one electronic circuit part has been attached, layer by layer, on top of said microelectromechanical chip part sealed by the cover part, and that bonding members have been manufactured onto the surface of the topmost electronic circuit part for the external connections of the microelectromechanical component.

103. A microelectromechanical electric impedance matching unit comprising:

a microelectromechanical chip part sealed by a cover part, which cover part contains lead-in structures for bringing electric connections through the cover part, characterized in, that at least one electronic circuit part has been attached, layer by layer, on top of said microelectromechanical chip part sealed by the cover part, and that bonding members have been manufactured onto the surface of the topmost electronic circuit part for the external connections of the microelectromechanical component.

104. A microelectromechanical inclination compensated compass comprising:

a microelectromechanical chip part sealed by a cover part, which cover part contains lead-in structures for bringing electric connections through the cover part, characterized in, that at least one electronic circuit part has been attached, layer by layer, on top of said microelectromechanical chip part sealed by the cover part, and that bonding members have been manufactured onto the surface of the topmost electronic circuit part for the external connections of the microelectromechanical component.

* * * * *